United States Patent [19]

Iwata

[11] Patent Number: 5,015,177
[45] Date of Patent: May 14, 1991

[54] WAFER HANDLING APPARATUS

[75] Inventor: Yoshiki Iwata, Yamato, Japan

[73] Assignee: Canon Kabushiki Kaisha, Tokyo, Japan

[21] Appl. No.: 453,188

[22] Filed: Dec. 15, 1989

Related U.S. Application Data

[63] Continuation of Ser. No. 68,246, Jun. 30, 1987, abandoned.

[30] Foreign Application Priority Data

| Jul. 4, 1986 | [JP] | Japan | 61-156243 |
| Aug. 8, 1986 | [JP] | Japan | 61-185304 |
| Aug. 29, 1986 | [JP] | Japan | 61-201815 |
| Oct. 27, 1986 | [JP] | Japan | 61-253695 |

[51] Int. Cl.$^5$ .............................................. F27B 9/00
[52] U.S. Cl. .................................. 432/121; 432/5; 432/152; 432/128; 432/253
[58] Field of Search ............... 432/5, 6, 11, 152, 253, 432/121, 120

[56] References Cited

U.S. PATENT DOCUMENTS

| 3,946,484 | 3/1976 | Aronstein et al. | 29/569 |
| 3,946,931 | 3/1976 | Bahnck et al. | 228/6 A |
| 4,520,834 | 6/1985 | DiCicco | 134/63 |
| 4,555,273 | 11/1985 | Collins et al. | 432/11 |
| 4,626,203 | 12/1986 | Sakamoto | 432/239 |
| 4,669,938 | 6/1987 | Hayward | 432/253 |
| 4,692,115 | 9/1987 | Aldridge et al. | 432/250 |

FOREIGN PATENT DOCUMENTS

| 948048 | 5/1974 | Canada . |
| 0219826 | 10/1985 | European Pat. Off. . |
| 0178336 | 4/1986 | European Pat. Off. . |
| 0242067 | 3/1987 | European Pat. Off. . |
| 0244202 | 4/1987 | European Pat. Off. . |
| 2036562 | 2/1971 | Fed. Rep. of Germany . |
| 2160283 | 6/1972 | Fed. Rep. of Germany . |
| 60-183736 | 9/1985 | Japan . |
| 8403196 | 8/1984 | PCT Int'l Appl. . |
| 8706561 | 4/1986 | PCT Int'l Appl. . |
| 1314590 | 7/1970 | United Kingdom . |
| 1508748 | 4/1978 | United Kingdom . |
| 2091196 | 7/1982 | United Kingdom . |
| 2093132 | 8/1982 | United Kingdom . |
| 2159120 | 11/1985 | United Kingdom . |

Primary Examiner—Henry C. Yuen
Attorney, Agent, or Firm—Morgan & Finnegan

[57] ABSTRACT

A wafer handling apparatus has a common desk including a top surface having a front zone, a middle zone and a rear zone, the front zone being capable of receiving plural indexers functioning as a wafer sender and/or receiver, a couple of wafer processing units disposed adjacent lateral sides of the middle zone, a wafer baking oven disposed adjacent a middle of the rear zone, and a wafer handling mechanism disposed adjacent a middle of the front zone, the wafer processing units and the oven.

19 Claims, 20 Drawing Sheets

| STAR TYPE | | | |
|---|---|---|---|
| MULTI-OVEN | CT | HAND HMDS | S/R — R<br>S/R — S |

FIG. 2A

| MULTI-OVEN | CT | HAND HMDS | S/R — R<br>S/R — S |
|---|---|---|---|

FIG. 2B

| MULTI-OVEN | PIQ CT | HAND | S/R — R<br>S/R — S |
|---|---|---|---|

FIG. 2C

| MULTI-OVEN | CEL CT | HAND | S/R — R<br>S/R — S |
|---|---|---|---|

FIG. 2D

| MULTI-OVEN | SOG CT | HAND | S/R — R<br>S/R — S |
|---|---|---|---|

FIG. 2E

| MULTI-OVEN | ND | HAND (ND) | S/R — R<br>S/R — S |
|---|---|---|---|

FIG. 2F

| MULTI-OVEN | PD | HAND (PD) | S/R — R<br>S/R — S |
|---|---|---|---|

FIG. 2G

| MULTI-OVEN | PD | HAND PEB | S/R — R<br>S/R — S |
|---|---|---|---|

FIG. 2H

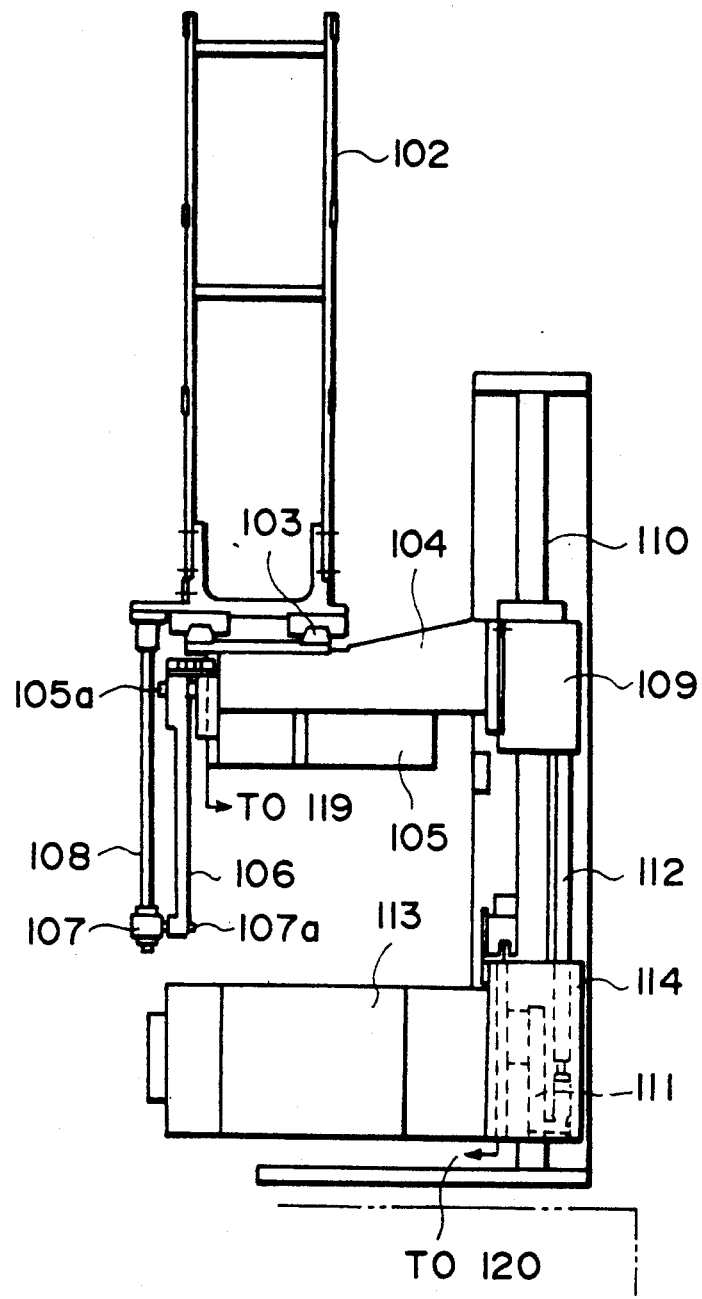
F I G. 5

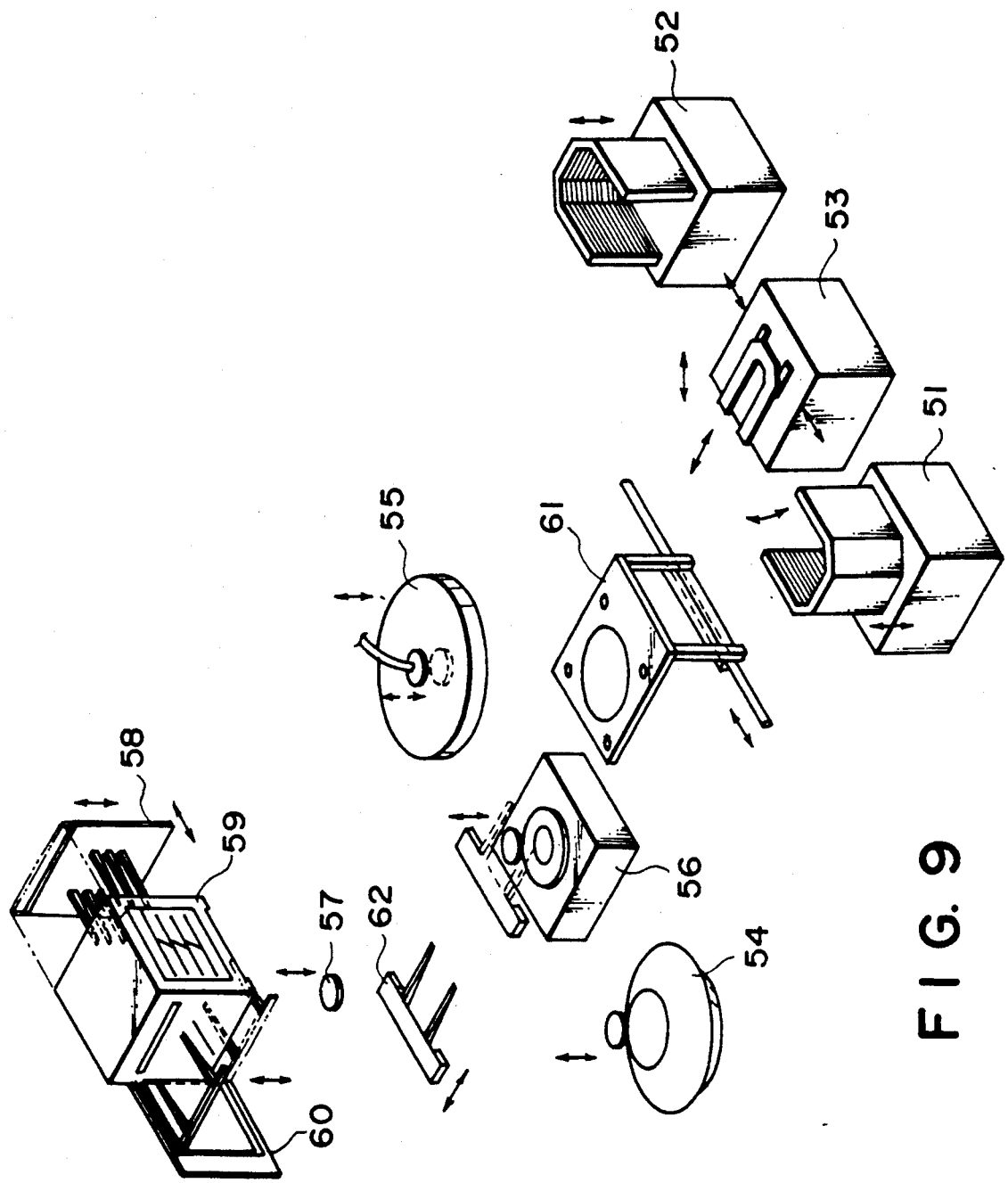

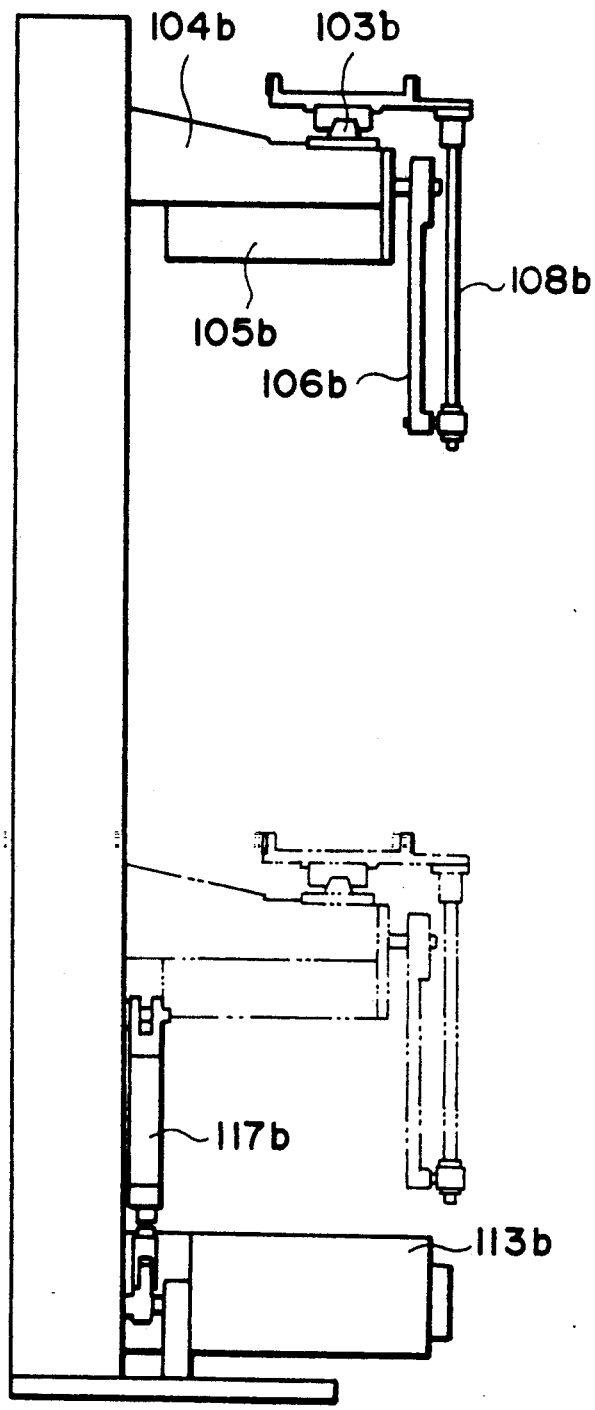
F I G. 15

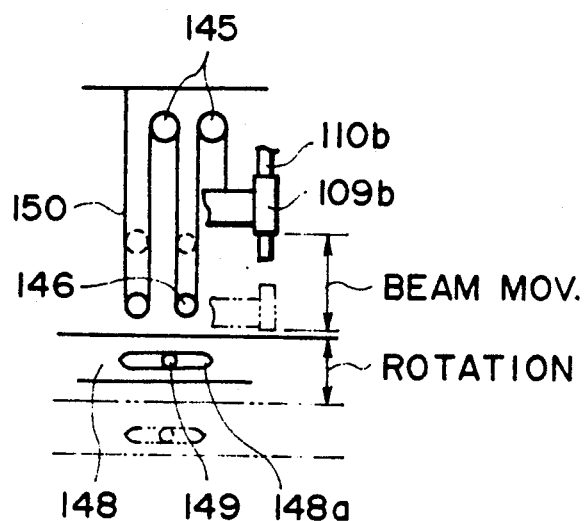
F I G. 17
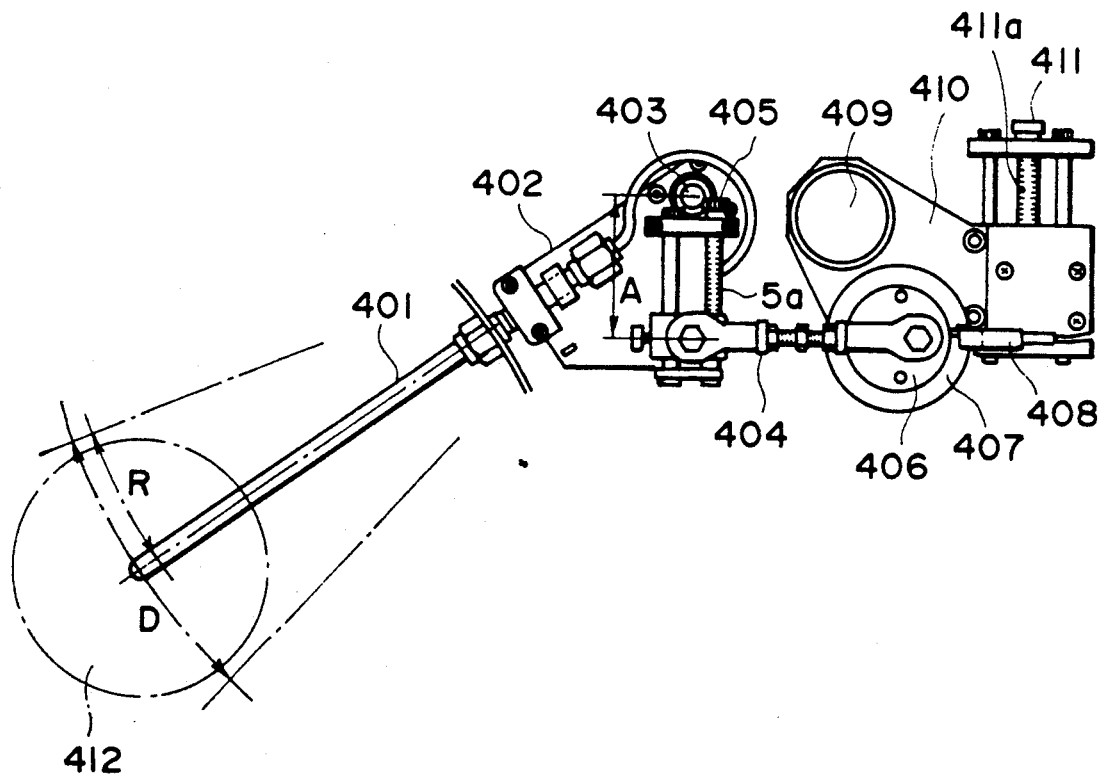
F I G. 20

WAFER HANDLING APPARATUS

This is a continuation of co-pending application Ser. No. 07/068,246, filed on June 30, 1987, now abandoned.

FIELD OF THE INVENTION AND RELATED ART

The present invention relates to a wafer handling apparatus, particularly to a device arrangements of a compound system including a scrubber, coater, developer and baking device which are indispensable as peripheral apparatuses for a semiconductor manufacturing plant.

Conventionally, the aligner peripheral devices are arranged in a line because the wafer is conveyed in a straight line using a belt conveying system. Therefore, the width of the entire apparatus is determined by, for example, the number of hot plates for baking wafers and the number of cup units for various processing operations, so that with the increase of the numbers of these units, the width of the apparatus is increased, which is disadvantageous. Additionally, those devices are contained in a ventilated clean chamber to maintain the cleanness, the ventilated clean chamber has to be designed and produced for the change or modification of each of the units or the like, which is another problem. Further, each of the units and parts involves problems to be solved.

SUMMARY OF THE INVENTION

Accordingly, it is a principal object of the present invention to provide a wafer handling apparatus which is small in an overall size.

It is another object of the present invention to provide a wafer handling apparatus which is able to easily meet to a change or modification of the units.

It is a further object of the present invention to provide a wafer handling apparatus which is possible to provide a ventilated clean chamber of a predetermined size.

It is a further object of the present invention to provide a wafer handling apparatus which is suitable to meet an automatic manufacturing line.

It is a further object of the present invention to provide units which are small in size and/or which are accurate and speedy in operation.

These and other objects, features and advantages of the present invention will become more apparent upon a consideration of the following description of the preferred embodiments of the present invention taken in conjunction with the accompanying drawings.

In this invention, the units are arranged on a top surface of a common desk and are enclosed so as to constitute a ventilated clean chamber or a thermal chamber. When a wafer is cooled in association with baking operation of the wafer, a forced cooling unit for cooling the wafer may be placed on the top of an oven on a rear line or placed adjacent a center of a middle line.

According to an embodiment of the present invention, a wafer baking oven as a peripheral apparatus for the aligner has a multi-stage structure in the vertical direction and is disposed adjacent a center on a rear line, and therefore, the space can be saved and that the heating source means can be concentrated in arrangement. Additionally, two kinds of processing units can be disposed left and right sides on the middle line. Thus, the wafer transfer between each of the units and the wafer carrier can be accomplished without using belt. Also, various units are arranged two-dimensionally, so that a ventilated clean chamber having a predetermined size can be placed at the upper part of the apparatus. Since the wafer carrier is disposed on the front line (near to the operator) on the top of the desk, and therefore, it is easy to meet adaption to automatic line together with other apparatuses.

BRIEF DESCRIPTION OF THE DRAWINGS

FIGS. 2A-2K are schematic plan views of various modified arrangement patterns.

FIG. 5 is a right side view of the step-up beam device.

FIG. 8 is a schematic plan view of unit arrangement pattern on the common desk according to another embodiment of the present invention.

FIG. 9 is a perspective view illustrating a detailed structure of the arrangement pattern of FIG. 9.

FIGS. 14-16 are front, side and rear views of a step-down beam device.

FIG. 17 illustrates a principle of a running block.

FIG. 20 is top plan view of an example of chemical applicator mechanism usable with FIG. 10 arrangement.

DESCRIPTION OF THE PREFERRED EMBODIMENTS

Figure 1:
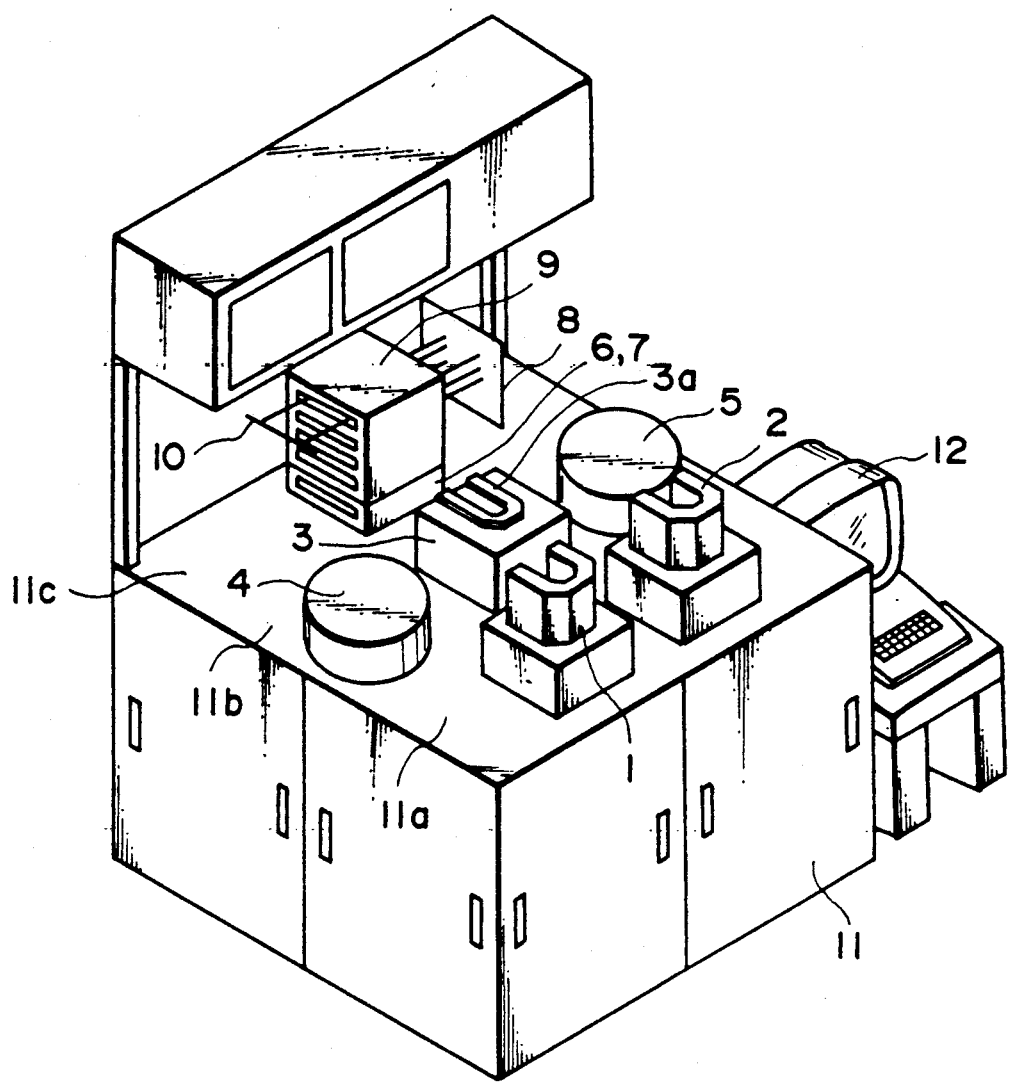
FIG. 1 is a perspective appearance of a wafer handling system according to an embodiment of the present invention.

Referring to FIG. 1, there is shown an appearance of the wafer handling apparatus according to an embodiment of the present invention, wherein a top surface of a common desk which can be constructed as a ventilated clean chamber by an unshown shield chamber is divided into front line zone, an intermediate or middle line zone 11b and a rear line zone 11c in the order named from the operator side. In the front zone 11a, indexers 1 and 2 are disposed at left and right sides. In the intermediate zone 11b, a handling mechanism 3 is disposed adjacent the center, and cup units 4 and 5 are disposed at its left and right sides, and in the rear zone 11c, there is disposed adjacent the center a combination of a forced cleaning unit 6 having a chuck 7 and a multi-stage oven 9 having plural hot plates arranged vertically, the multi-stage oven 9 being disposed above the forced cleaning unit 6. Each of the units on the top of the desk is enclosed by transparent members constituting a chamber (not shown), so that the inside thereof can be protected by a ventilated clean chamber device by enclosing with transparent members. Designated by a reference 12 is a computer for system control.

Figure 2:
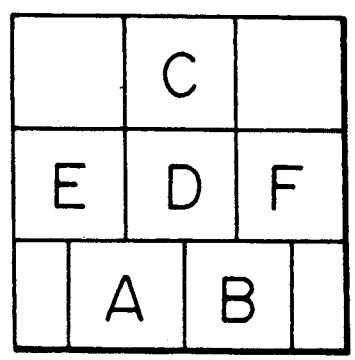
FIG. 2 is a schematic plan view of arrangement pattern of devices on a common clean chamber ventilated according to the embodiment.

A typical example of arrangement pattern of the units on the top of the common desk 11 is shown in FIG. 2, which are so-called star arrangements.

In FIG. 2, indexers having wafer carriers commonly or exclusively usable as a sender and a receiver are disposed at left and right sides A and B in the front line zone. At the left and right sides E and F in the middle zone, cup units for various processing devices such as a coater, developer, scrubber and post exposure baking. In the middle C of the rear line zone, a multi-stage oven and a forced cleaning unit are arranged vertically. In the middle D of the middle line zone enclosed by those units, a beltless hand mechanism 3 for transporting wafers is disposed. The beltless hand mechanism 3 includes a wafer carrying or supporting portion 3a which is directable to and insertable into each of the units to take out the wafers or to place the wafers into the unit. The structure of the beltless hand mechanism 3 may be in the form disclosed in Japanese Laid-Open Patent Application 60-183736, for example.

According to this star arrangement, various units can be disposed at the middle left and right regions E and F. Various selections and interchanging will provide various systems.

FIGS. 2A–2K shows various examples of star arrangement, wherein reference character CT designates a coater; HMDS, an applicator for applying an agent for enhancing close contact; PIQCT, a coater for applying polyimide resist; CELCT, a coater for applying solvent containing a light absorbing agent; SOGCT, a coater for an intermediate layer for multiresist; ND, a negative developer; PD, a positive developer; PEB, a post exposure baker; CELDev, a peeling unit for the film containing the light absorbing agent; DeepUV, a deep UV hardening unit; S/R, a sender and receiver; SC, a scrubber; and "S" means exclusively for sender; "R" means exclusively for receiver. The multi-stage oven is provided with a forced cooling unit at the bottom thereof.

Figure 2K:
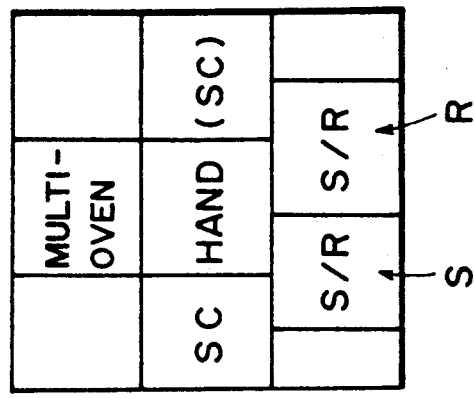
Figure 2J:
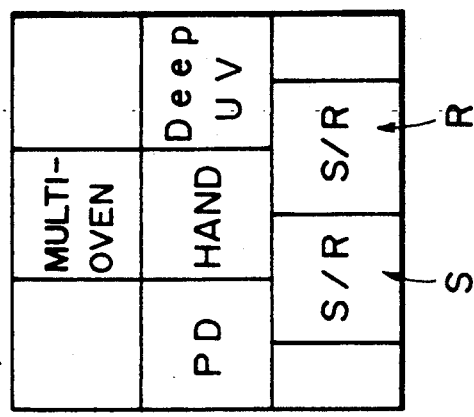
Figure 2I:
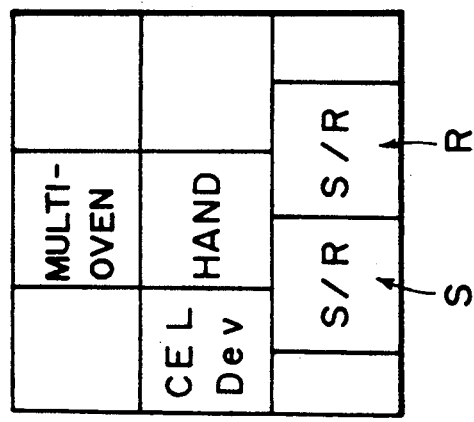

In FIGS. 2F, 2G and 2K, for example, same kinds of units are disposed at left and right sides. In this arrangement, the units are operated alternately to process the wafers continuously, and the processed wafers by the units are alternately and sequentially transported to the oven so that the central hand mechanism is efficiently used, whereby the throughput is increased without additional transporting means. Further in this arrangement, it is possible to dispose same kinds of units in place of the oven, and the alternately processed wafers are sequentially transported to the sender and receiver unit.

Figure 3:
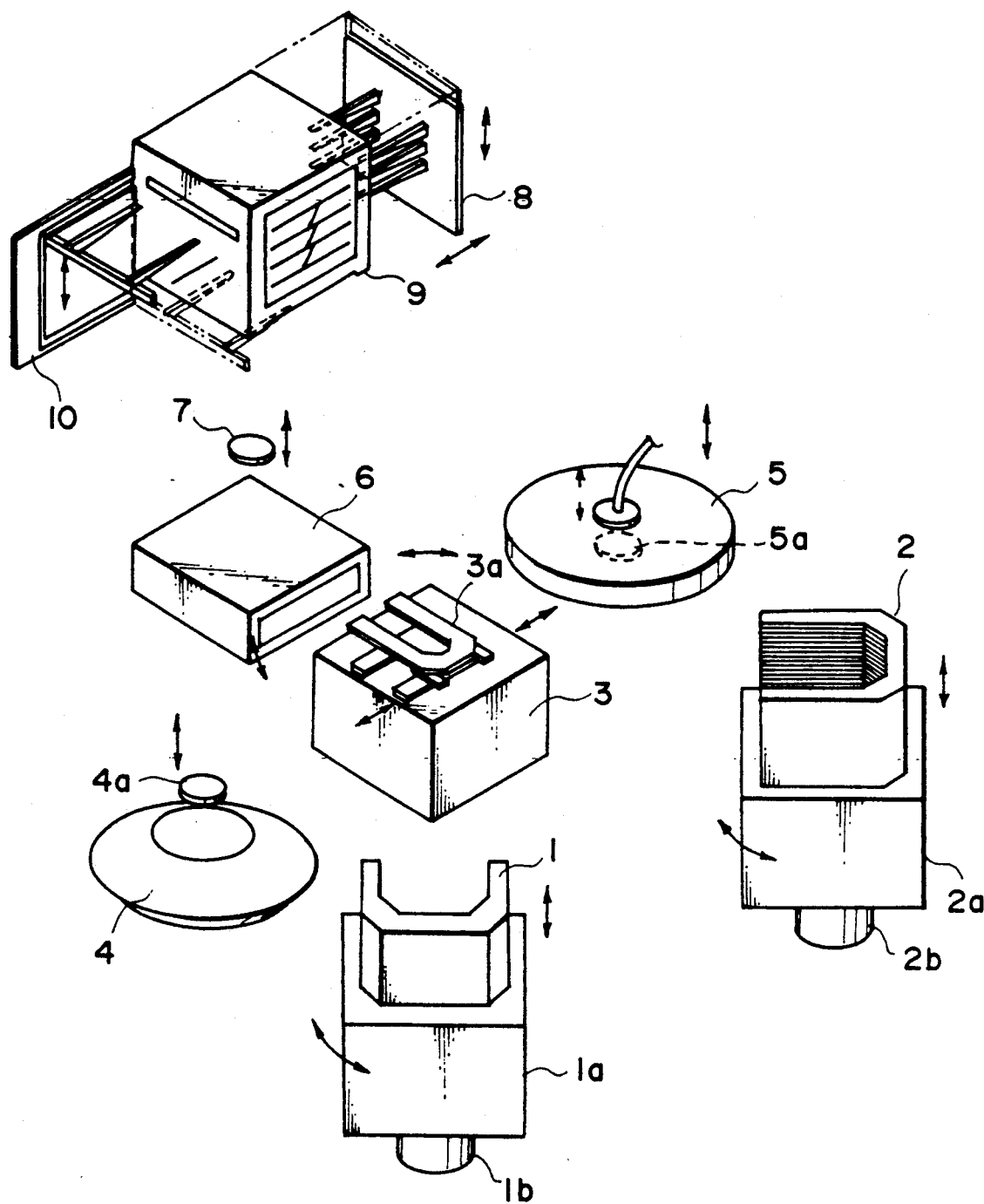
FIG. 3 is a perspective view of a detailed structure of the system arranged according to the pattern.

FIG. 3 shows an enlarged view of the star type unit arrangements on the desk in an enlarged scale. In this Figure, a reference numeral 4a designates a wafer chuck for the unit 4; 5a, a wafer chuck for the unit 5; and 7, a wafer chuck for the cooling unit 6. They are vertically movable within a predetermined stroke.

Indexers 1 and 2 are supported on elevator units 1a and 2a so that they are vertically movable when the wafer is taken out or collected back. Further, the units 1a and 2a are provided with rotating mechanisms 1b and 2b so that the directions of the entire indexers can be changed. Those indexers 1 and 2 are disposed near the front side, that is, the operator side so as to facilitate an indexer exchanging operation, since they are faced to a street for the operator and/or an indexer exchanging robot. The elevator units 1a and 2a are faced straight to the street (front side) as shown in FIG. 1 when the indexers 1 and 2 are to be exchanged so as to facilitate the exchanging operation. When the units 4 and 5 start the processing operation after completion of the exchange of the indexer 1 and the exchange of the indexer 2, the wafer accessible sides of the indexers 1 and 2 are faced to the handling mechanism 3 by the elevator units 1a and 2a with the rotating mechanisms 1b and 2b, as shown in FIG. 3. The operation of the rotating mechanisms is controlled by the computer 12 instructing the start of operation.

The handling mechanism 3 performs under the control of the controlling computer 12 a wafer transfer operation to and from the indexers 1 and 2, a wafer transfer operation among the wafer chucks 4a, 5a and 7 for the units 4, 5 and 6, respectively and movement of the wafer among them.

The handling mechanism 3 is effective to insert the hand into below the wafers in the indexers 1 and 2 and the wafers retained on the chuck 4a, 5a and 7 at high positions, and then to receive the wafers by raising the hand. After the wafer is transported to a desired position, the hand is lowered to place the wafer in another indexer or another chuck, and then the hand is retracted to its initial position.

Figure 4:
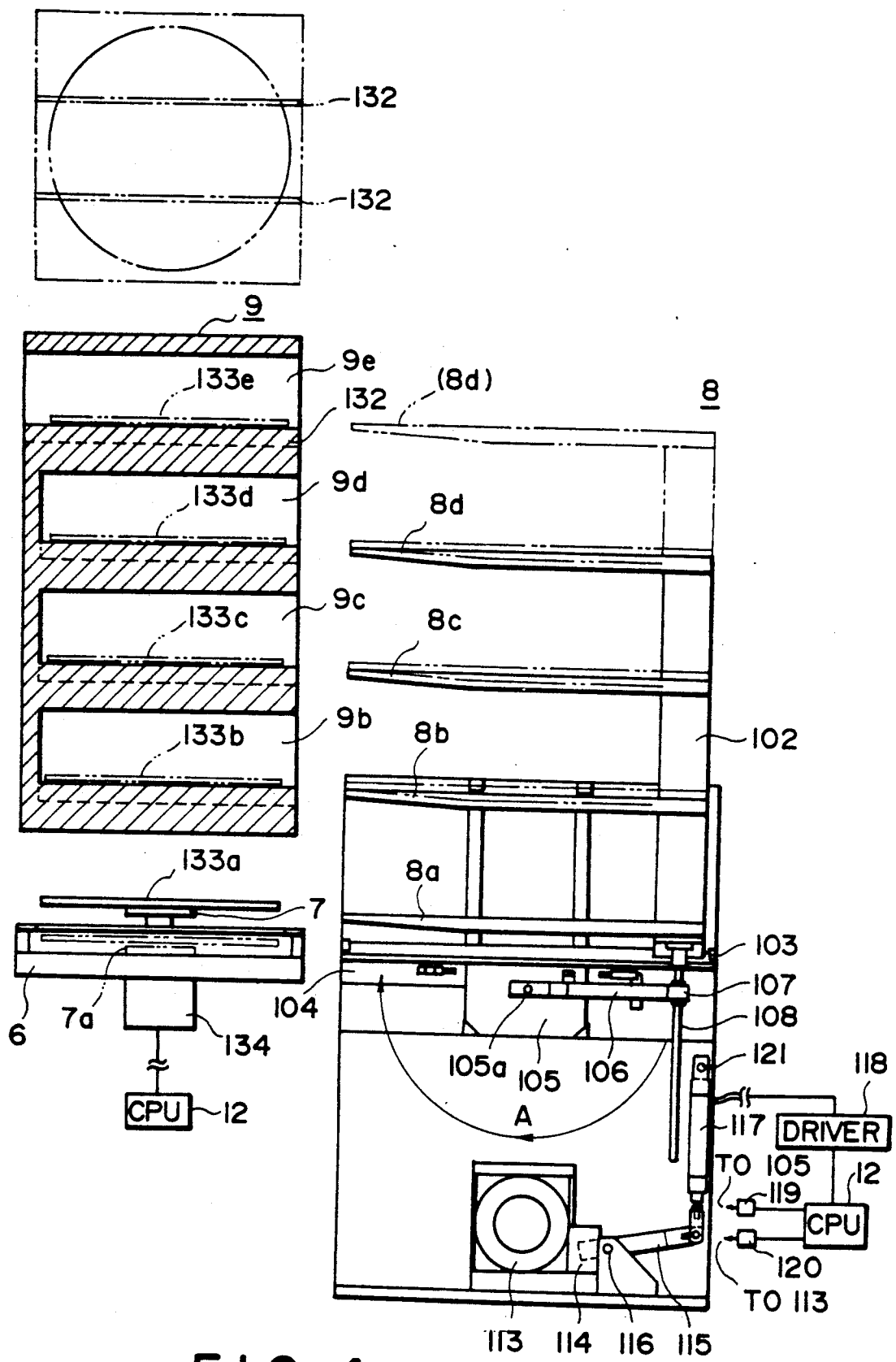
FIG. 4 is a front view illustrating arrangement of multi-stage oven, a cooling unit and step-up beams.
Figure 6:
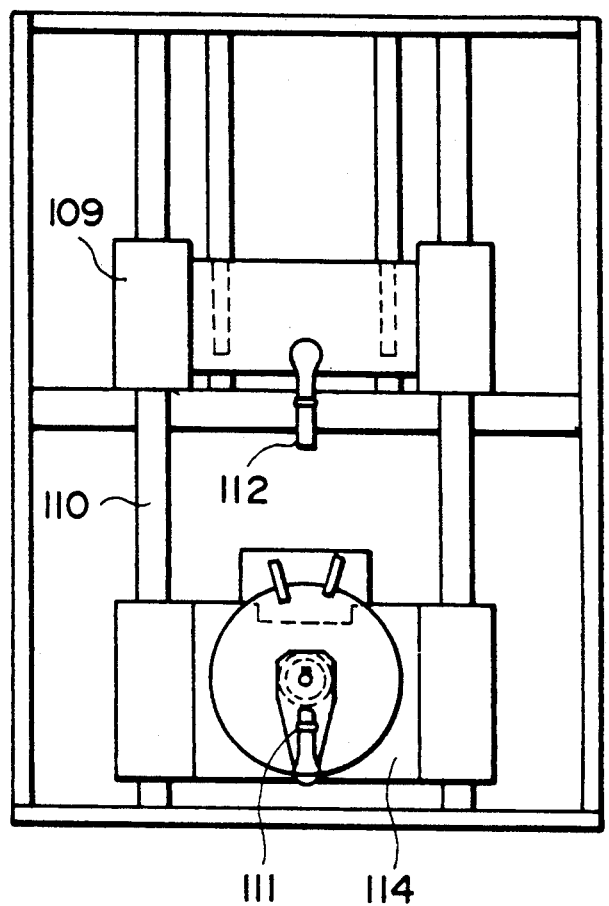
FIG. 6 is a rear view of a part of the step-up beam device.

FIG. 4 shows detailed structure of the forced cooling unit 6 with its a chuck 7 therefor, the multi-stage oven 9 and a step-up beam device 8. FIG. 5 is a right side view of the step-up beam device, and FIG. 6 is a rear view of a part thereof.

In FIG. 4 which is a front view, wafer accessing ports 9a–9d for the stages of the multi-stage oven 9 are faced rightwardly, and the left side of the top stage is also opened to the left side as a port 9e. Each of the supporting plates for the stages, as shown in FIG. 4, is provided with grooves 132 for allowing insertion and vertical movements of the beams 8a–8d of the step-up beam device 8.

The forced cooling unit 6 and its chuck 7 are disposed below the multi-stage oven 9, and the cooling unit 6 is provided with the chuck 7 and a mechanism 134 for vertically moving the chuck 7, which are controlled by the controlling computer 121.

At the right side of the multi-stage oven 9 and the cooling unit 6, there is a step-up beam device 8. A lifted position of the chuck 7 of the cooling unit 6 is a position for the bottommost beam 8a of the step-up beam device 8 to receive the wafer. In FIG. 4, this is indicated by a position of the wafer 133a.

In FIG. 4, at the left side of the multi-stage oven 9, a step-down beam device 10 is disposed, which, however, is omitted from the Figure for the sake of simplicity. The step-down beam assembly 10 is of a construction similar to the step-up beam device 8. However, it contains only one set of beams, and the stroke of the beams is an integer multiple of the stroke for the step-up beam device 8, more particularly, the number of stage of the oven multiplied by the stroke, since the step-down beam device 10 moves once between the outlet port 9e at the top stage of the oven 9 and the raised wafer transferring position of the chuck 7 as indicated by the wafer 133a.

Referring to FIGS. 4–6, detailed explanation will be made with respect to the multi-stage oven provided with the step-up beam device 8 and the forced cooling unit 6.

In FIGS. 4–6, the step-up beam device 8 comprises beams 8a–8e for transporting wafers while supporting them at the bottoms of the wafers, the beams are vertically arranged at regular intervals. It further comprises a supporting member 102 for supporting the beams, rails 103 for slidingly translating the supporting member 102 leftwardly and rightwardly in FIG. 4, a vertically movably stage 104 integral with the rails 103, a first servo motor 105 mounted on the vertically movable stage 104, a rotational axis 105a of the first servo motor 105, a rotatable arm 106 fixed to a rotatable shaft 105a, a ring slider 107 for the arm 106 which is mounted to an end of the rotatable arm 106 for rotational movement about the shaft 105a, and a bar 108 fixed to the supporting member 102 on which the slider 107 is engaged for longitudinal sliding movement. As shown in FIG. 5, the step-up beam device 8 further comprises a slider 109 integral with the vertically movable stage for sliding movement together with the stage 104, a vertical guide 110 for guiding the slider 109, a crank mechanism 111 for reciprocating the slider 109 in a vertical direction, a rod 112 for transmitting the force from the crank mechanism 111 to the slider 109, a second servo motor 113 for rotating the crank mechanism 111, a slider 114 for the motor, which supports the second servo motor 113 and is slidably movable along the vertical guide 110, a lever 115 for lifting the motor slider 114, a pivot 116 for the lever 115 provided at a stationary portion, a piston mechanism 117 for lifting the motor slide 114 through the lever 115, a piston driver 118 for driving the piston mechanism by fluid supply. The first servo motor 105 and the second servo motor 114 are rotated or stopped in accordance with power supply from power sources 119 and 120, while the piston driver 118, the power source 119 and the power source 120 are controlled by the controlling computer 121 on the basis of the fluid supply and the power supply.

The step-up beam device 8 takes the position shown by solid lines in FIG. 4 with respect to the multi-stage oven 9 when it is at the bottommost position and it is not inserted into the oven 9, whereas it takes the chain line position when it is at the topmost position and it is not inserted thereinto. On the top surface of each of the stages of the oven 9, grooves 132 are formed to allow insertion of the associated beams 8a–8d, as shown in FIG. 4.

Operation of the step-up beam device 8 will be explained. The wafers are disposed at positions indicated by references 133a, 133b, 133c and 133d. The wafer 133e is supposed to be conveyed externally, in association with start of step-up beam device 8 operation, by the step-down beam device 10. The computer 12 instructs the power source 119 to rotate the first servo motor 105 by approximately 180 degrees in a direction of an arrow A. Then, the arm 106 swings by the rotation of the motor 105 so that the arm slider 104 moves along a half of the circumference about the shaft 105a. Since the arm slider 107 is movable only vertically on the bar 108, the vertical components of the force applied to the slider 107 from the motor 105 are absorbed by the arm slider 107 moving vertically relative to the bar 108, and therefore only the leftward component is transmitted to the bar 108. Therefore, together with leftward movement of the arm slider 107, the supporting member 102 integral with the bar 108 moves leftwardly. As a result, the beams 8b–8d advance through the grooves 132 of the stages of the oven 9, and the bottommost beam 8a also advances in the manner of sandwiching the wafer transfer chuck 7 with the bottom of the oven 9, whereby the beams are placed below the respective wafers. Because a such a mechanism is used to move the wafers leftwardly or rightwardly, the wafers are moved slowly at the start and at the end, while they are moved at a high speed in the middle. Upon completion of 180 degree rotation of the first servo motor 105, the computer 12 stops the first servo motor 105 and then instructs the piston driver 118. The top of the piston mechanism is mounted to a fixed portion, and when the computer 12 operates the piston mechanism 117, the motor slide 114 is lifted. At this time, the crank mechanism 111 is at rest at the position shown in the Figure so that the slider 109 is also lifted by the rod 112. Thus, the beams 8a–8d are lifted by the amount of the slider 109 raise, and a part of the beams are raised beyond the top of the grooves 132 to receive the wafers. Then, the computer 12 instructs the power source 119 to rotate the first servo motor 105 in the direction opposite to that indicated by the arrow A by the amount of 180 degrees. By this, each of the beams 8a–8d are retracted rightwardly while supporting the bottom of each of the wafers to restore the original position. Upon completion of this operation, the computer 12 instructs the power source 120 to rotate the second servo motor 113 through 180 degrees from the position shown in the Figure. At this time, the rotation of the crank mechanism 111 further lifts the slider 109 with the aid of the rod 112. The distance of the lifting is substantially equal to the level interval between adjacent top surfaces of the stages of the multi-stage oven 9, that is, substantially equal to the vertical interval between adjacent beams 8a–8d. The positions of the beams are indicated by chain lines in FIG. 4. The wafers are lifted to such positions. Thereafter, the computer 12 instructs the power source 119 to rotate in the direction of the allow A through 180 degrees. The beams 8a–8d are inserted again abut now into the stages corresponding to the current levels while supporting the wafers, so that each of the wafers are brought to the respective next upper stages. Upon completion of 180 degree rotation of the motor 105, the computer 12 instructs the piston driver 118 to restore the piston mechanism 117. Then, the motor slider 114 kept at a higher level by the lever 115 lowers to the original position so that the beams 8a–8d lower into the grooves 132 by the corresponding amount. The wafers on the beams 8a–8d are now supported on the top surfaces of the oven stages upon termination of the beam lowering operation, so that they are away from the respective beams. The computer 12 again instructs the power source 119 to rotate the first servo motor 105 in the direction opposite to the arrow A by 180 degrees. The beams 8a–8d moves back, that is, in the rightward direction through the respective grooves 132 to take the original position. Finally, the computer 12 instructs the power source 113 to rotate again the second servo motor 113 through 180 degrees. The crank mechanism 111 takes the original position, and the beams 8a–8d also take the original position, namely the positions indicated by solid lines in FIG. 4. Through the series of operations described above, the wafers are conveyed into the respective next upper ovens. This is repeated at predetermined baking time periods, whereby the wafers are moved sequentially through all the ovens of the multi-stage oven 9, and finally the wafers are conveyed to the external chuck 7 from the topmost stage by the step-down beam device 10. The baking temperatures of the oven stages of the multi-stage oven is set higher at higher stage, and therefore the wafer is subjected to the heat-treatment at higher temperatures at higher ovens, whereby a photoresist which tends to peel off by abrupt temperature change can be heat-treated. The temperature difference may be opposite or the temperatures may be set to be the same.

As will be understood from FIG. 3, the handling mechanism 3 is disposed at the front side of the cooling unit 6, and therefore the direction of the wafer transfer to the from the unit 6 is perpendicular to the direction of the wafer transfer to and from the step-up beam device 8.

The wafer transfer to and from the chuck 7 by the handling mechanism 3 is performed when the chuck 7 takes its lower position as shown by chain lines 7a in FIG. 4.

When a wafer is heat-treated by the multi-stage oven 9, the vertical movement mechanism 134 for the unit 6 lowers the chuck 7 together with the unit 6 in accordance with the instructions from the computer 12, if the chuck 7 is not at the wafer transferring position with respect to the handling mechanism 3. If the chuck 7 has been lowered to the wafer transferring position with respect to the handling mechanism 3, the operation is not required. The handling mechanism 3 directing to the multi-stage oven 9 expands its hand to insert a wafer to a position indicated by chain lines, and then, lowers the hand so that the chuck 7 passes through the space between the fingers of the hand, thereby to transfer the wafer onto the chuck 7. When the hand is away from the bottom surface of the wafer, the hand is collapsed, while the chuck 7 catches the wafer by positively attracting it. Thereafter, the computer 12 actuates the vertical moving mechanism 134 to lift the wafer together with the chuck 7 and stops it at the wafer transferring position to and from he bottommost beam 8a of the step-up beam device 8. This position is indicated by the wafer 133a in FIG. 4. After the wafer is stopped at the wafer transfer position, the computer 12 operates the step-up beam device 8 to perform the above-described wafer moving operation, and simultaneously operates the step-down beam device 10 to bring the wafer 133e out of the topmost oven.

When the computer instructs such that the beam 8a of the step-up beam device 8 to raise the wafer from the transfer chuck 7, the wafer attracting mechanism of the chuck is released immediately. After the step-up beam device 8 moves a wafer before the heat-treatment from the wafer transfer chuck 7, the step-down beam device 10 places the wafer after the heat-treatment onto the wafer transfer chuck 7. When the computer 12 instructs such that the beam of the step-down beam device 10 places the wafer onto the chuck 7, the wafer attracting mechanism of the chuck 7 starts operate immediately. When the step-down beam device 10 restores its original position, the computer 12 instructs the vertical movement mechanism 134 to lower the wafer carrying chuck 7 to the position indicated by chain lines (7a) in FIG. 4.

Then, the computer moves the U-shaped hand of the handling mechanism 3 to the wafer transfer position while keeping the hand at its lower position. The position indicated by the chain lines (7a) is slightly higher than the position of the hand when the U-shaped hand is inserted. Thereafter, the chucking action of the chuck 7 is released, and the hand is slightly raised so that the wafer is received on the hand. By this, the wafer is away from the chuck 7 and is raised to the position indicated by the chain lines. The handling mechanism 3 bring the wafer by collapsing the hand after completion of the treatment.

The forced cooling unit 6 is provided therein with a transfer chuck and with a mechanism for vertically moving the the chuck. The transfer chuck is similar to the upper wafer transfer chuck 7. The vertical movement mechanism is effective to move the chuck between a wafer transfer position with respect to the handling mechanism 3 and a lower position for the wafer cooling. When the unit vertical movement mechanism 134 keeps the wafer transfer chuck 7 at the position indicated by the solid lines in FIG. 4, the position (chain line wafer position) at which the handling mechanism 3 sends or receive a wafer is within the forced cooling unit 6, as will be understood from the Figure. The position is the wafer transfer position between the forced cooling unit 6 and the handling mechanism 3. Therefore, the handling mechanism 3 effects the wafer transfer operation to and from the forced cooling unit 6 when the unit vertical movement mechanism 134 lifts the unit, whereas when it lowers the unit, the handling mechanism 3 effects the wafer transfer to and from the chuck 7.

The topmost stage of the multi-stage oven may be replaced by a forced cooling unit, whereby the heat-treated wafer from the multi-stage oven is immediately cooled, and it is returned to the indexer with its temperature being the room temperature. In the case of coater, a unit for measuring a film thickness is disposed further above the forced cooling unit, so that the film thickness of the coating of the treated wafer is immediately measured. In a case of a positive developer, a deep UV hardening unit may be provided thereabove.

Figure 7:
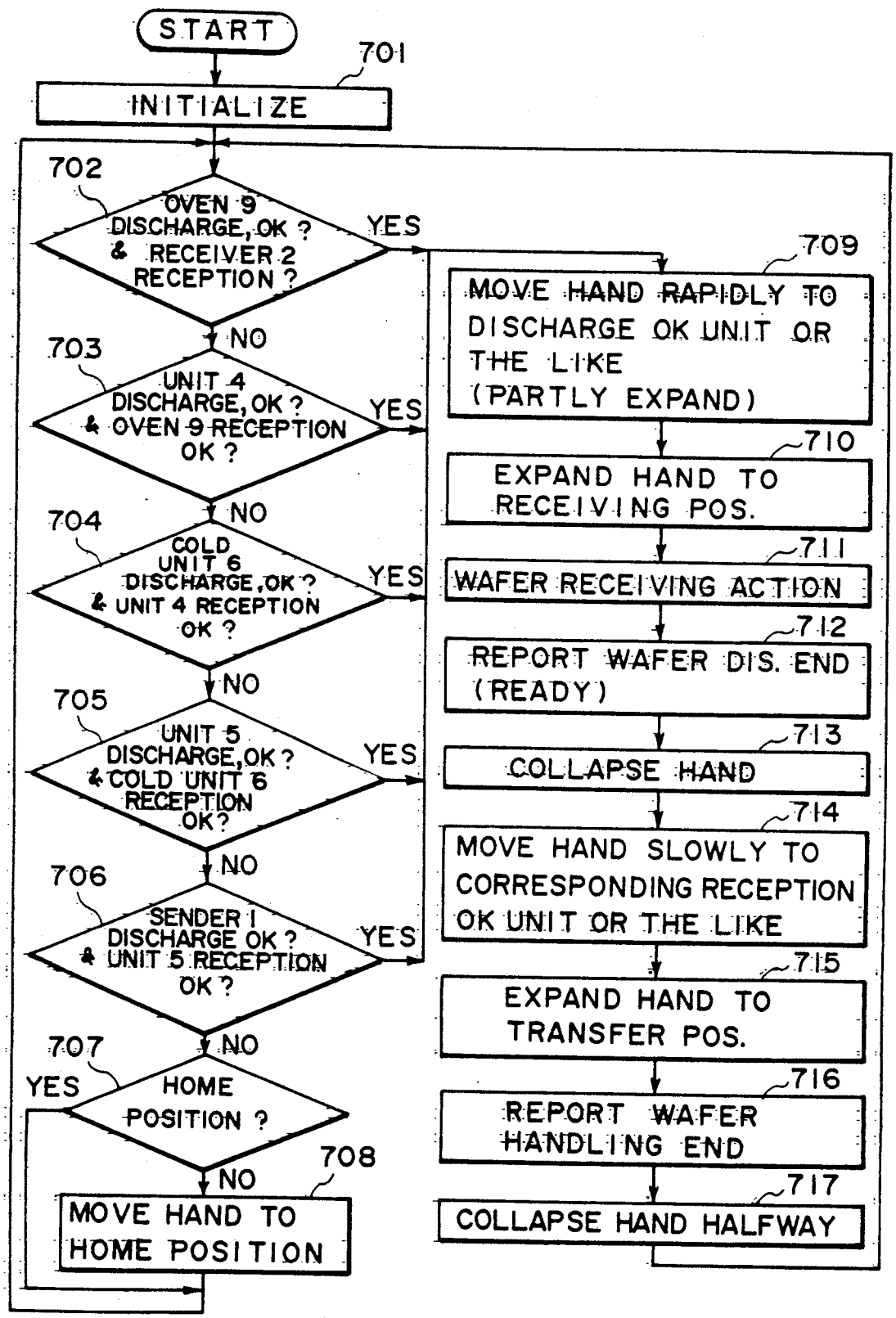
FIG. 7 is a flow chart illustrating an example of operational sequences.

FIG. 7 is a flow chart illustrating sequential operations of the wafer transportation among the units, the multi-stage oven and the indexers by the handling mechanism.

As will be understood from this flow chart, the sequence is established such that after the handling mechanism 3 is placed at its home position at step 701 in response to an operator's starting instruction, the preference is placed on the wafer conveyance to and from the multi-stage oven 9 among the various processing units. More particularly, the steps 702–706 are the steps for discriminating conditions of various combinations between the wafer sending stations and the wafer receiving stations for receiving the sent wafer, wherein the step 702 is given the highest preference; the step 703 is given the second preference; and the preferences are given in the order of the number down to the step 706. If an answer for one of steps 702–706 is affirmative (Y), the following handling steps 709–717 are executed to the wafer sending portion and the wafer receiving portion which correspond to the combination meeting the condition of the affirmative step. If the affirmative answer is not produced in any one of steps, the discrimination is made as to whether the handling mechanism 3 is at its home position as step 207. If not, it is moved to the home position at step 708, and the sequence goes back to the step 702. The handling mechanism 3 is kept at the stand-by state until the affirmative answer is made in one of steps 702–706.

In the multi-stage oven 9, periodic wafer moving operations are effected by the step-up beam device 8 and the step-down beam device 10. It is noted that the wafer transfer chuck 7 is both for receiving an unbaked wafer from the handling mechanism 3 to transfer it to the step-up beam device 8 and for receiving a baked wafer from the step-down beam device 10 to transfer it to the handling mechanism 3, and therefore, when a baked wafer is transferred to the chuck 7 by the step-down mechanism 10, it is desirable for the handling mechanism 3 to go to the chuck 7 to receive it so quickly as to avoid that it is returned to the oven 9, since if it occurs, the baked wafer will be over-baked. It is for this reason that the step 702 is given the first preference. The order of the preference among the steps 703–706 are suitably determined in consideration of the processes in the units and the time required for the processing.

The discrimination at step 702 is as to whether or not the baked wafer from the step down beam 10 is transferred to the chuck 7; the unit 6 lowers; a send demand of the baked wafer from the oven 9 is produced; and the receiver 2 to receive it has an empty stage, that is, the stage not accommodating the wafer.

The discrimination at the step 703 is as to whether or not the wafer treated by the unit 4 (coater for example) is retained on the chuck 4a; a send demand from unit 4 is produced; the step-up beam device 8 to the oven 9 to receive it is in the state before a process of going to the chuck 7 to receive the wafer; and the wafer chuck 7 is empty and is at a wafer transfer position between the handling mechanism 3.

The discrimination at the step 704 is as to whether or not a wafer treated by the cooling unit 6 is supported on its chuck; a send demand from the cooling unit 6 is produced; and the chuck 4a of the unit to receive it is empty.

The discrimination at the step 705 is as to whether or not a wafer treated by the unit 5 (the close contact increasing agent applying station, for example) is retained on its chuck 5a; a send demand from the unit 5 is produced; the cooling unit 6 to receive it is empty; its chuck is empty; the unit 6 is at lifted position in association with the cyclic operations of the beam devices 8 and 10.

The discrimination at the step 706 is as to whether or not there is a sendable wafer in the sender 1; the unit 5 is empty; and its chuck 5a is empty.

In order to obtain necessary signals for the above discriminations, the sender 1 and the receiver 2 are provided with sensors for detecting absence and presence of a wafer for each of the wafer accommodating stages. Each of the chucks 4a, 5a and 7 and the chuck of the unit 5 is provided with a sensor for producing a signal representative of presence or absence of a wafer attracted thereby. When the sensor of each of the chucks detects the presence of a wafer which has been subjected to the operation of the corresponding unit in association with operations of the corresponding unit 4, 5 or 6, the oven 9 and beam devices 8 and 10, the wafer send demand signal OUT (ready for send) for the associate unit is produced. When the wafer is transferred from the chuck to the handling mechanism 3 so that the chuck becomes empty, an operation completion signal READY (ready for reception) is produced for the corresponding unit or the like. When the chuck receives the wafer from the handling mechanism 3, a wafer handling completion signal BUSY is produced. At the steps 702–706, each of the combinations of the conditions at each of the unit or the like, i.e., "OUT", "READY (BUSY)", is discriminated on the basis of those signals.

The sequential operation of the handling mechanism 3 at steps 709–717 will be described. At step 709, the hand of the handling mechanism 3 is moved at a high speed to a chuck for the sender or unit or the like where the send demand (OUT) is produced. At step 710, the hand is expanded to the receiving position. At step 711, predetermined handling operations are performed to receive the wafer. When the wafer is received by the hand, the process completion signal (READY) is produced by the unit from which the wafer is send, at step 712. Then, at step 713, the hand is collapsed. At step 714, the wafer is moved at a low speed by the handling mechanism 3, including rotational, forward and backward movements, to the unit or the like to receive the wafer. At step 715, the hand is expanded to the wafer transfer position of the receiving unit or the like. At step 716, upon completion of the wafer transfer to the chuck or the like, a handling completion signal (BUSY) is produced. At step 717, the hand which is now empty is collapsed half way, and the sequence goes back to the step 702.

In this manner, the handling mechanism 3 performs handing operation among the units or the like. The fundamental wafer transporting operation in the sequence of FIG. 7 is "sender 1 - (hand) - unit 5 - (hand) - cooling unit 6 - (hand) - unit 4 - (hand) - chuck 7 - (step-up beam device 8) - multi-stage oven 9 - (step-down beam device 10) - chuck 7 - (hand) - receiver 2". In this sequence, the operations by the handling mechanism 3 is indicated by "(hand)".

It should be understood that the sequential operation shown in the flow chart of FIG. 7 is only an example, and the order of the steps 702–706 is not limited to this.

FIG. 8 illustrates an arrangement pattern on the common desk top according to another embodiment of the present invention. In this embodiment, the handling mechanism is disposed in the region D in the front zone; the forced cooling unit is disposed in the region G at the center of the middle zone, as contrasted to the FIG. 2 arrangement. This is suitable for meeting future modification for incorporating the entire apparatus into a lined system.

More detailed arrangements of FIG. 8 example are shown in FIG. 9, wherein the apparatus comprises sender-and-receivers 51 and 52 at both sides in the front line zone, a handling mechanism 53 in the center of the front line zone, cup units 54 and 55 at both sides of the middle line zone, a forced cooling unit 56 in the center of the middle line zone, a wafer transfer chuck 57, a step-up beam device 58, a multi-stage oven 59, a step-down beam device 60, an X-axis hand device 61 for lateral transportation, and a Y-axis hand device 62 for back and forth movement. This arrangement is not much different from FIG. 3 arrangement in that the hand devices for the wafer transportation are disposed in the central portion. The X-axis hand device for lateral transportation is for the transfer of the wafer among the forced cooling unit 56, the cup units 54 and 55. It is provided with an unshown chucking mechanism for catching a wafer at the bottom thereof, wherein a wafer supporting portion of the handling mechanism 53 penetrates between two posts. It is disposed right above the forced cooling unit 56 although it is seen in the Figure as if they are apart.

The sequential operation of the FIG. 9 example is substantially the same as the case of FIG. 3, and therefore, the detailed explanation is omitted for the sake of simplicity.

As described in the foregoing, according to this embodiment, the wafer carrier can be disposed in the front side for any processing devices since the top of the common desk is divided into the front line zone, the middle line zone and the rear line zone, wherein the necessary processing units are disposed in the middle line zone. Therefore, the system of the present invention is advantageous in that it can be easily incorporating it into an automatic line system. Additionally, since a wafer handling mechanism is disposed in the middle of the middle line zone, either of the left and right indexers may be used as sender and receiver, or one of them can be used as a buffer during wafer processing period, so that the variations of the wafer handling operation can be wider. Also, two cup units can be disposed at both sides of the middle line zone, respectively, and various combinations of the processing units can be selected without making the system longer. The system can be constructed as a predetermined dimension (e.g. modulated) ventilated clean chamber, and therefore the cleanness and the temperature control are assured. Further, a wafer baking oven of a vertical multi-stage type is disposed in the middle of the rear line zone, whereby the heating means can be suitable to a concentrated control, and simultaneously, the required floor area does not increase even if the number of baking stages increases so that it is advantageous in the required space.

Referring to FIGS. 10-18, an example of resist film application will be described.

When the indexer 1 and/or 2 is to be exchanged, the elevator unit 1a and/or 2a is faced right toward the street to facilitate the indexer exchange. After completion of the exchange of the indexer and upon start of the resist film formation, the elevator unit 1a and/or 2a is rotated by the rotating mechanism 1b and/or 2b so that the wafer accessing port is faced to the handling mechanism 3. More particularly, at the start and end of the operation, the rotating mechanisms 1b and 2b are instructed by the CPU of the control system 12 to rotate the elevator units 1a and 2a. In the apparatus, the instructions from the CPU of the control system 12 control the handling mechanism 3, the elevator units 1a and 2a, the step-up beam device 8 and step-down beam device 10.

When the indexer 1 is placed on the elevator unit 1a, and the rotating mechanism 1b causes the wafer access port to face the handling mechanism 3, elevator unit 1a moves vertically to set the height of the indexer 1 at a level for taking a wafer to be processed out of the indexer. The handling mechanism rotates to be directed to the indexer 1 and expands the hand with its U-shaped supporting portion 3a at the lower position. The portion 3a is inserted into below the wafer to be taken out of the indexer 1. Subsequently, the hand (supporting or retaining portion 3a) is lifted to receive the wafer, and then the hand is collapsed to take the wafer out of the indexer 1. The handling mechanism 3, while supporting the wafer, is directed to the coater 4. At this time, the chuck 4a within the coater 4 is lifted to the transfer position, and the handling mechanism 3 lowers its U-shaped supporting portion 3a to allow the chuck 4a to pass through the central space of the supporting portion 3a so that the wafer is now supported on the chuck 4a. Thereafter, the hand of the handling mechanism 3 is collapsed, and the chuck 4a of the coater 4 is lowered to set the wafer at the coating position within the coater cup 4b, where the resist is applied onto the wafer.

Figure 10:
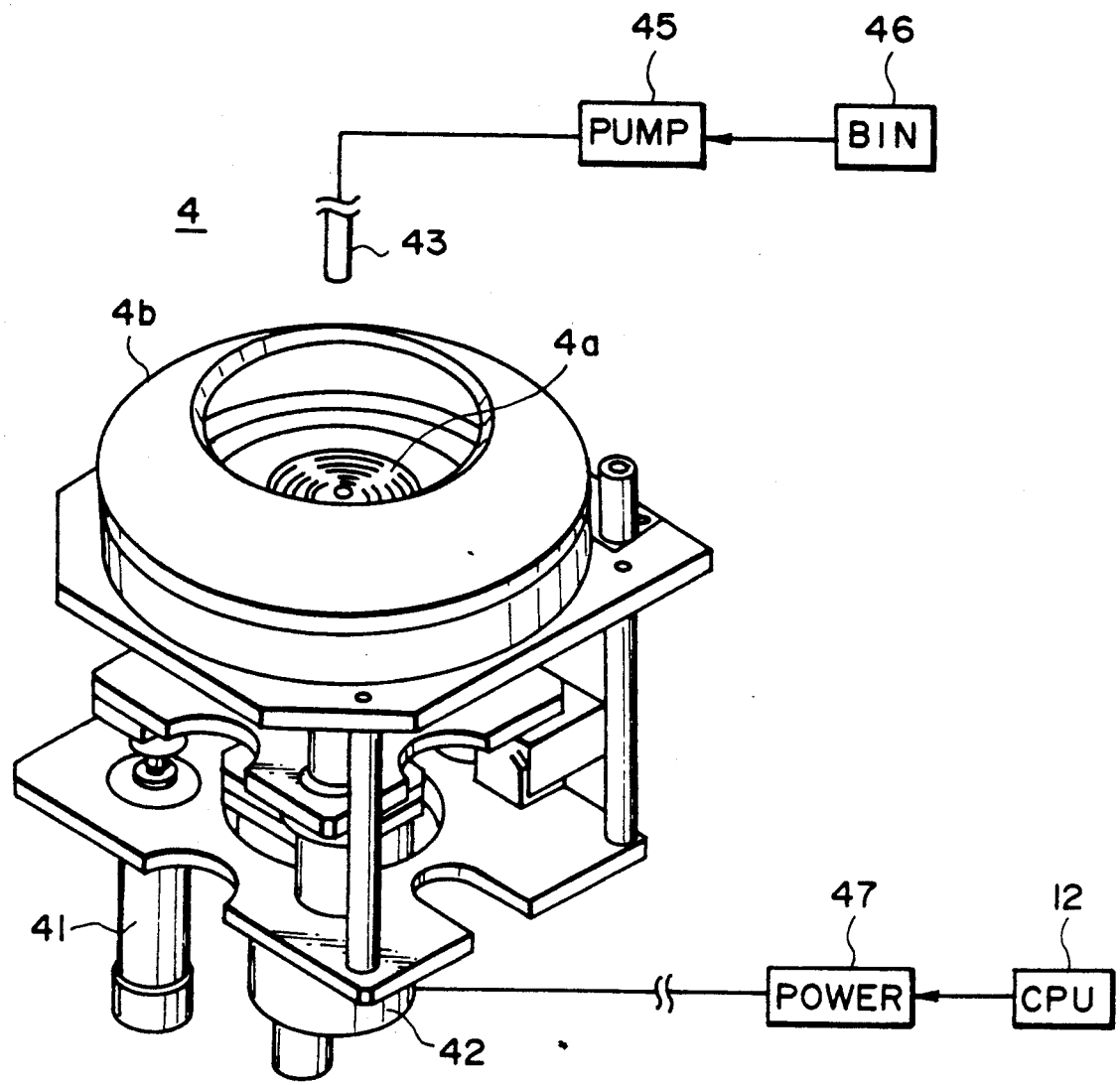
FIG. 10 is a perspective view illustrating a structure of an example of a coater.

FIG. 10 shows the structure of the coater 4. The chuck 4a is vertically movable by the vertical movement mechanism 41 upon the wafer transfer operation, and is rotationally driven at the time of coating operation by the servo motor 42. When the wafer is placed at the coating position, an unshown nozzle moving mechanism brings a resist dropping nozzle 43 above the wafer. The nozzle 43 communicates a resist supplying pump 45 and a resist containing bin 46. When the coating operation is to be started, a start signal is transmitted to the power source 47 for the servo motor 42 to rotate it, and simultaneously the pump 45 is actuated to supply the resist from the resist bin 46 to the nozzle 43. By doing so, the resist is dropped through the nozzle 43 onto the wafer, and then the resist is uniformly distributed over the wafer surface by the centrifugal force imparted by the rotation of the wafer, so that the wafer is coated. After a predetermined period of time, the pump 45 stops, and a predetermined time after, the power source 47 receives a stop signal. The nozzle moving mechanism retracts the nozzle 43 from above the wafer, thus terminating the coating process.

Referring back to FIGS. 1 and 3, after the completion of the coating operation, the chuck 4a is again lifted to the wafer transfer position; the handling mechanism 3 expands the hand while keeping its lower position; the hand lifts the wafer from the top surface of the chuck 4a through the central space; and then the wafer handling mechanism 3 collapses the hand to retract the wafer; and the chuck 4a lowers. Thereafter, the handling mechanism 3 is rotated to face the wafer transfer chuck 7.

Subsequently, the handling mechanism 3 expands the hand to bring the wafer to above the wafer transfer chuck 7, and then lowers the hand to place the wafer on the wafer transfer chuck through the central space of the U-shaped supporting portion 3a. After the wafer and the supporting portion 3a are away, the hand is collapsed. When the wafer is placed on the chuck 7, the wafer is chucked thereon by an unshown wafer attracting means. Thereafter, the step-up beam device 8 shifts the wafers in the multi-stage heat treating device 9. Simultaneously, the step-down beam device 10 lowers the wafer from the topmost stage of the multi-stage heat treating device 9, if any. When the control system 12 produces an instruction signal to lift the wafer on the wafer transfer chuck 7 to the step-up beam device 8 for the wafer shifting, the chucking is released immediately. After the step-up beam device 8 moves the wafer before heat treatment from the wafer transfer chuck 7, the step-down beam device 10 brings the heat treated wafer to the wafer transfer chuck 7. When the control system 14 produces an instruction signal to lower the wafer onto the transfer chuck 7 to the step-down beam device 10, the attracting means immediately starts the attracting operation. When the step-down beam 10 is placed back to its original position, the handling mechanism 3 inserts the hand below the wafer sandwiching the wafer transfer chuck 7 in the central space of the hand while the supporting portion 3a is being kept at its lower level. When the chucking is released, the supporting portion 3a of the handling mechanism 3 is lifted, and the wafer is moved away from the chuck 7 and is supported on the supporting portion 3a. Subsequently, the handling mechanism 3 collapses the hand to take the processed wafer out.

The handling mechanism 3 is then faced to the indexer 1 or 2, the wafer is put back through reversed operations to the indexer 1 at the position from which the wafer is taken out or to an empty stage of the indexer 2 functioning as a receiver.

Figure 11:
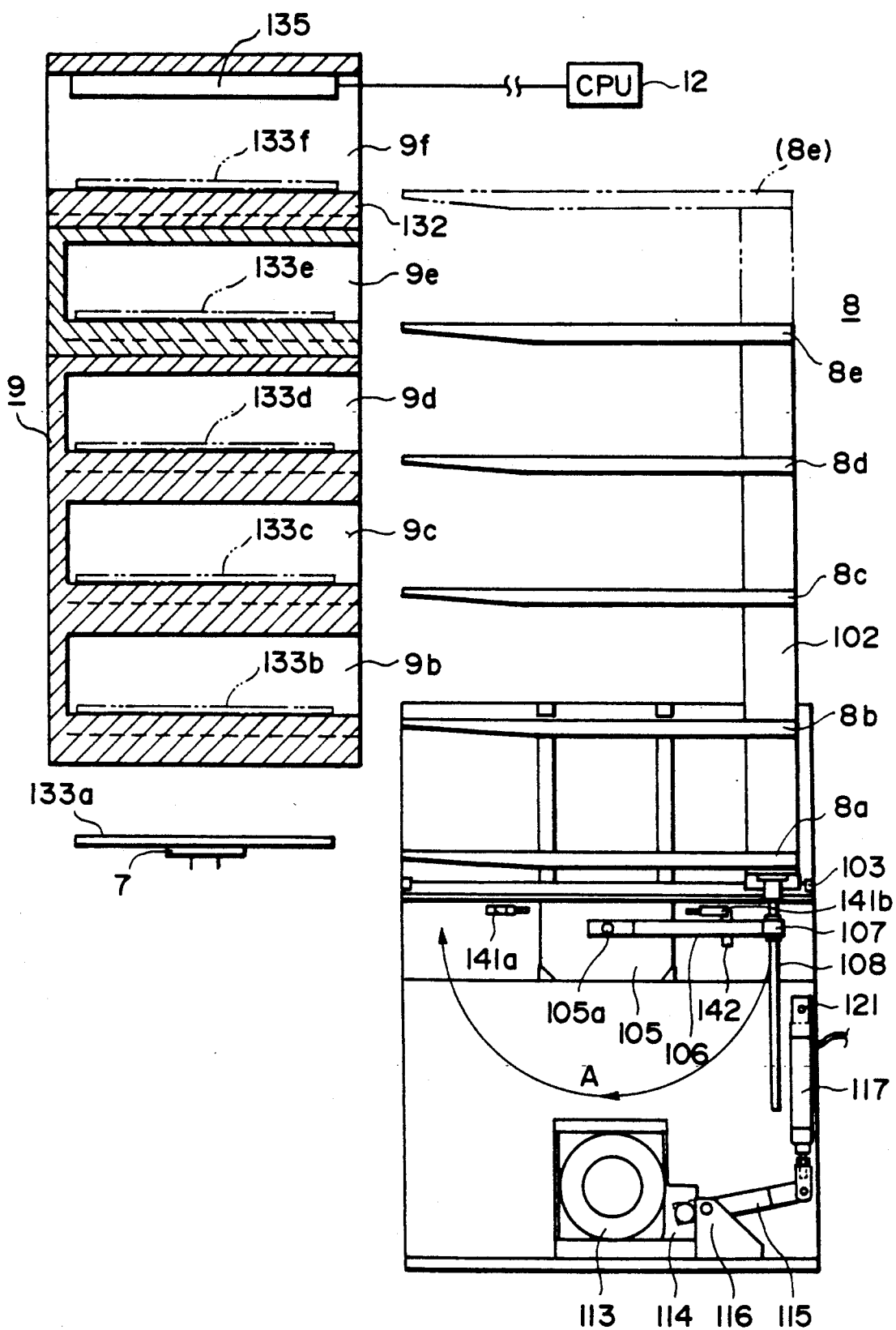
FIG. 11 is a front view of a step-up beam device and a multi-stage heat-treating device.
Figure 12:
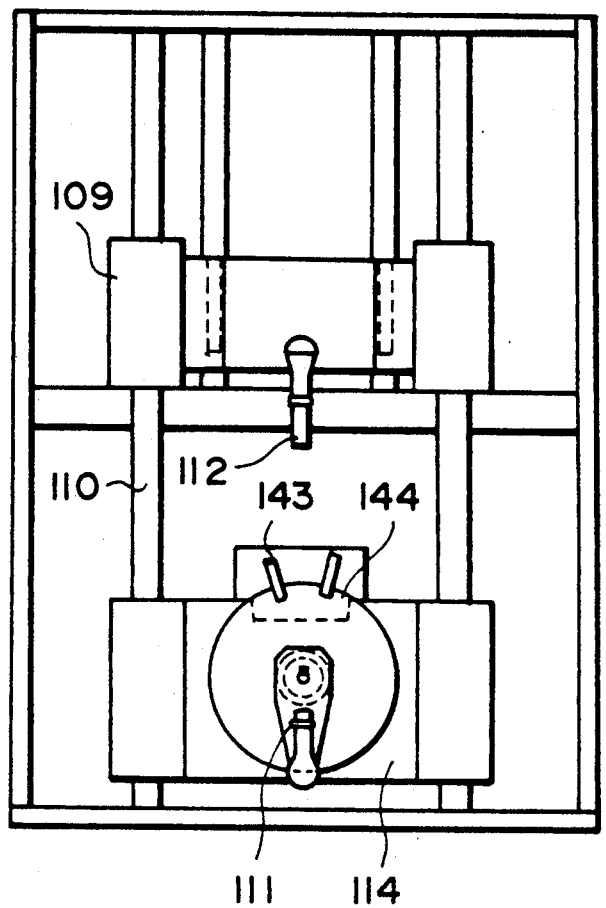
FIGS. 12 and 13 are rear and side views of the step-up beam device.
Figure 13:
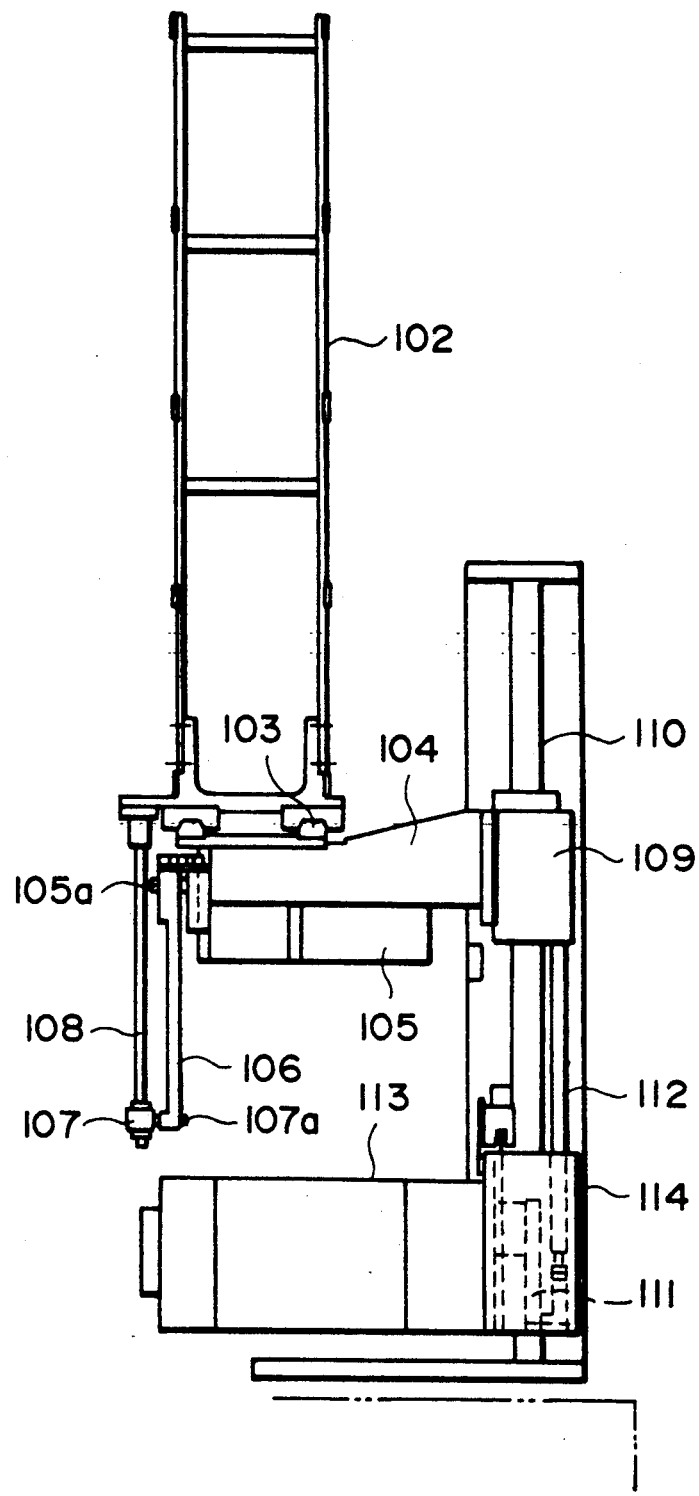

Referring to FIGS. 11-16, another example of peripheral devices of the multi-stage heat treating device 9 is shown. FIG. 11 is a front view of the combination of the step-up beam device 8 and the multi-stage heat treating device 9. FIGS. 12 and 13 are rear and side views of the step-up beam device 8.

In FIGS. 11-13, the step-up beam device 8 comprises beams 8a-8e for transporting wafers while supporting them at the bottoms of the wafers, the beams are vertically arranged at regular intervals. It further comprises a supporting member 102 for supporting the beams, rails 103 for slidingly translating the supporting member 102 leftwardly and rightwardly in FIG. 5, a vertically movably stage 104 integral with the rails 103, a first servo motor 105 mounted on the vertically movable stage 104, a rotational axis 105a of the first servo motor 105, a rotatable arm 106 fixed to a rotatable shaft 105a, a ring slider 107 for the arm 106 which is mounted to an end of the rotatable arm 106 for rotational movement about the shaft 105a, and a bar 108 fixed to the supporting member 102 on which the slider 107 is engaged for longitudinal sliding movement. As shown in FIG. 12, the step-up beam device 8 further comprises a slider 109 integral with the vertically movable stage for sliding movement together with the stage 104, a vertical guide 110 for guiding the slider 109, a crank mechanism 111 for reciprocating the slider 109 in a vertical direction, a rod 112 for transmitting the force from the crank mechanism 111 to the slider 109, a second servo motor 113 for rotating the crank mechanism 111, a slider 114 for the motor, which supports the second servo motor 113 and is slidably movable along the vertical guide 110, a lever 115 for lifting the motor slider 114, a pivot 116 for the lever 115 provided at a stationary portion, a piston mechanism 117 for lifting the motor slide 114 through the lever 115, the piston mechanism being driven by an unshown driven supplied by fluid. The first servo motor 105 and the second servo motor 113 are rotated or stopped in accordance with power supply from power sources not shown, the piston driver and the power sources are controlled by the controlling system 12 on the basis of the fluid supply and the power supply.

The step-up beam device 8 takes the position shown by solid lines in FIG. 11 with respect to the multi-stage heat-treating unit 9 when it is at the bottommost position and it is not inserted into the oven 9, whereas it takes the chain line position when it is at the topmost position and it is not inserted thereinto. On the top surface of each of the stages 9b-9f of the heat-treating unit 9, grooves 132 are formed to allow insertion of the associated beams 8a-8d, as shown in FIG. 4.

Operation of the step-up beam device 8 will be explained. The wafers are disposed at positions indicated by references 133a, 133b, 133c, 133d, 133e and 133f. The wafer 133f is supposed to be conveyed externally, in association with start of step-up beam device 8 operation, by the step-down beam device 10. The control system 12 instructs the unshown power source for the first motor to rotate the first servo motor 105 by approximately 180 degrees in a direction of an arrow A in FIG. 11. Then, the arm 106 swings by the rotation of the motor 105 so that the arm slider 104 moves along a half of the circumference about the shaft 105a. Since the arm slider 107 is movable only vertically on the bar 108, the vertical components of the force applied to the slider 107 from the motor 105 are absorbed by the arm slider 107 moving vertically relative to the bar 108, and therefore only the leftward component is transmitted to the bar 108. Therefore, together with leftward movement of the arm slider 107, the supporting member 102 integral with the bar 108 moves leftwardly. As a result, the beams 8b-8d advance through the grooves 132 of the stages of the oven 9, and the bottommost beam 8a also advances in the manner of sandwiching the wafer transfer chuck 7 with the bottom of the oven 9, whereby the beams are placed below the respective wafers. Upon completion of 180 degree rotation of the first servo motor 105, a photocoupler 141a detects a light blocking plate 142 to produces a detect signal and transmits it to the control system 12. The control system 12 then stops the first motor 145, and thereafter instructs the piston driver. The top of the piston mechanism is mounted to a fixed portion 121, and when the computer 12 operates the piston mechanism 117, the motor slide 114 is lifted. At this time, the crank mechanism 111 is at rest at the position shown in the FIG. 12 so that the slider 109 is also lifted by the rod 112. Thus, the beams 8a-8d are lifted by the amount of the slider 109 raise, and a part of the beams 8a-8e are raised beyond the top of the grooves 132 to receive the wafers. Then, the control system 12 instructs the power source for the first motor to rotate the first servo motor 105 in the direction opposite to that indicated by the arrow A by the amount of 180 degrees. By this, each of the beams 8a-8e are retracted rightwardly while supporting the bottom of each of the wafers to restore the original position. A photocoupler 114b is provided to detect a stop position of the first motor. Upon completion of this operation, the control system 12 instructs the unshown power source for the second motor to rotate the second servo motor 113 through 180 degrees from the position shown in the FIG. 12. The rotation of the motor is detected by a photocoupler 143 and a disk 144 with slots and is transmitted to the control system 12. At this time, the rotation of the crank mechanism 111 further lifts the slider 109 with the aid of the rod 112. The distance of the lifting is substantially equal to the level interval between adjacent top surfaces of the stages of the multistage heat-treating unit 9, that is, substantially equal to the vertical interval between adjacent beams 8a-8e. The positions of the beams are indicated by chain lines in FIG. 11. The wafers are lifted to such positions. Thereafter, the control system 12 instructs the power source for the first motor to rotate in the direction of the allow A through 180 degrees. The beams 8a-8e are inserted again abut now into the stages 9b-9f corresponding to the current levels while supporting the wafers, so that each of the wafers are brought to the respective next upper stages. Upon completion of 180 degree rotation of the motor 105, the control system 12 instructs the piston driver to restore the piston mechanism 117. Then, the motor slider 114 kept at a higher level by the lever 115 lowers to the original position so that the beams 8a-8d lower into the grooves 132 by the corresponding amount. The wafers on the beams 8a–8e are now supported on the top surfaces of the stages 9b–9f upon termination of the beam lowering operation, so that they are away from the respective beams 8a–8e. The control system 12 again instructs the power source for the first motor to rotate the first servo motor 105 in the direction opposite to the arrow A by 180 degrees. The beams 8a–8e moves back, that is, in the rightward direction through the respective grooves 132 to take the original position. Finally, the control system 12 instructs the power source for the second motor 113 to rotate again the second servo motor 113 through 180 degrees. The crank mechanism 111 takes the original position shown in FIG. 12, and the beams 8a–8e also take the original position, namely the positions indicated by solid lines in FIG. 11. Through the series of operations described above, the wafers are conveyed into the respective next upper stages 9b–9f. By repeating these operations at a predetermined frequency, the wafers are conveyed sequentially upto the top stage through the stages 9b–9f.

Figure 14:
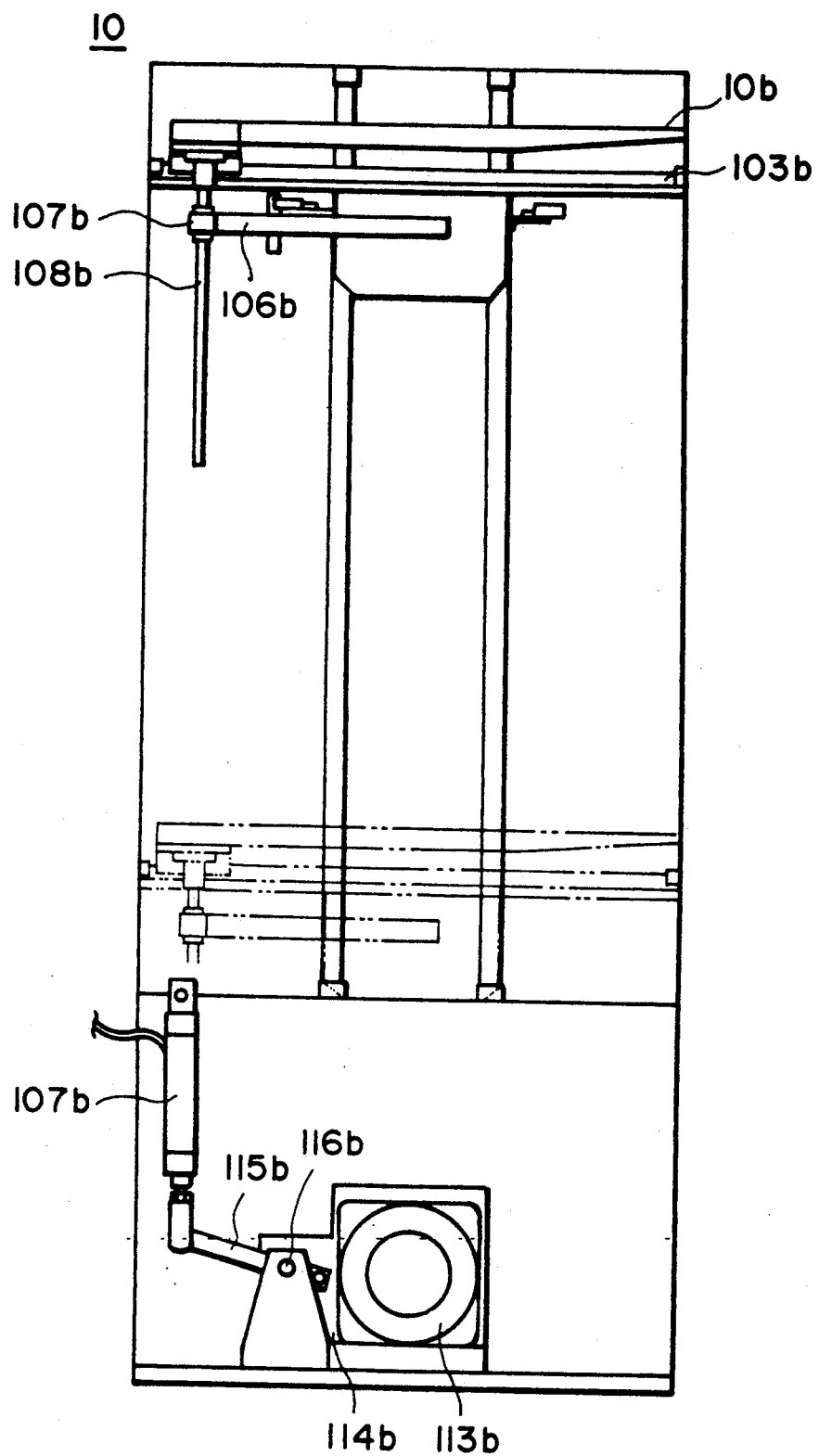
Figure 16:
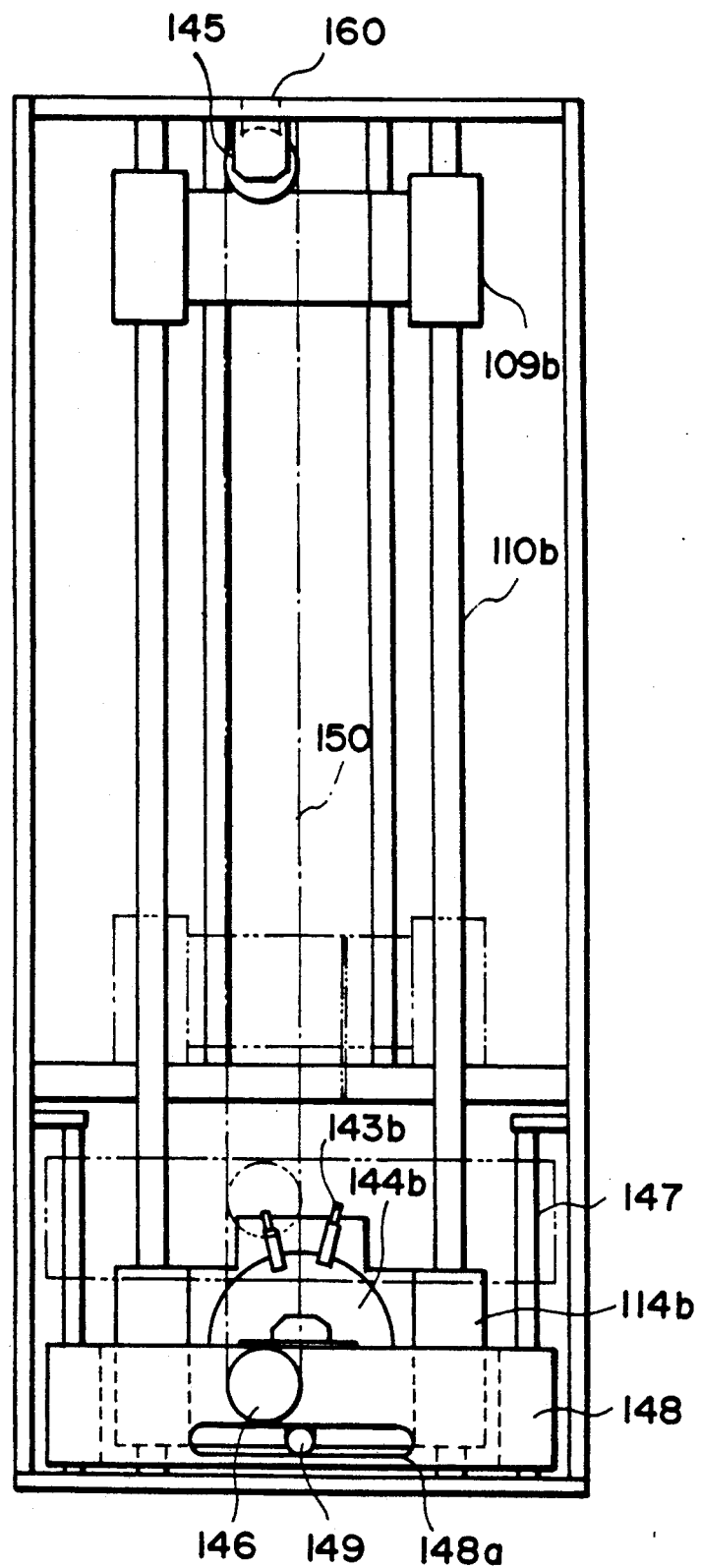

FIGS. 14, 15 and 16 are front, side and rear views of the step-down beam device 10. The structure and operational principle of the step-down beam 10 are substantially the same as those of the step-up beam device 8. However, since the step-down beam 10 is to function to convey the wafer from the topmost stage to the wafer tranfer chuck 7, only one set of beams 10b are used. Also, since the number of wafers to be conveyed is small, only one guide 103b is employed. Since the conveying stroke of the step-down beam device 10 is as large as approximately five times the stroke of the step-up beam device 8, a running block mechanism is used in place of the crank mechanism 111.

FIG. 17 shows the structure of the running block mechanism. A wire 150 has an end which is fixed to a first slider 109b and is trained around two stationary pulleys 145 and 145 mounted to a fixed portion 160 and around two running pulleys 146 and 146 mounted to a second slider 148 as shown in the Figure. The other end of the wire 150 is fixed to the fixed portion 160. The second slider 148 is substantially vertically movable along a second vertical guide 147 and is provided with a lateral groove 148a, into which a rod 149 mounted to an unshown rotational portion to be rotationally driven by a motor 113b is inserted for rotation and for lateral movement. When the rod 149 rotates through 180 degrees about a motor shaft from the state shown in the Figure, the second slider 148 is lifted by the rod 149, and simultaneously, the running pulleys 146 and 146 move upward. By this movement, the slider 109b lowers along the first vertical guide 110b through an amount, four times the lifting amount of the second slider 148. By this, a larger stroke than the crank mechanism 111 is accomplished using the similar driving source to the step-up beam device 8. When the motor 113b rotates, the operational relationship with the other motor and the cylinder is the same as with the step-up beam device 8, although the wafer conveying operation is reversed vertically to the case of the step-up beam device 8.

Next, the heat treating process and the film thickness measuring process for the wafer will be described.

Referring back to FIG. 11, the multi-stage heat-treating device 9 contains three stages of ovens and one stage of a forced cooling unit 9e on top thereof. Between the oven and the forced cooling unit 9e, there is provided a sufficient heat insulating material. The wafer which has been heat-treated by the ovens 9b–9d, is conveyed by the step-up beam device 8 to the upside forced cooling unit 9e where it is cooled. Above the forced cooling unit 9e, a film thickness measuring unit 9f is disposed, to which the cooling wafer is conveyed by the step-up beam device 8. Each of the bottom surface of the forced cooling unit 9e and the film thickness measuring unit 9f is provided with a groove or grooves 132 similarly to the ovens 9b–9d. The bottom surfaces are spaced at regular intervals vertically. By this structure, the wafer which has been cooled is subjected to the film thickness measuring operation without delay. The measured wafer is taken out through an opposite opening by the step-down beam device 10.

Next, the film thickness correcting process will be described. The wafer in the film thickness measuring unit 9f is measured in the film thickness by the film thickness sensor 135. The sensor 135 may be of a known construction. The data of the film thickness measurement is transmitted to the control system 12. The control system 12 first discriminates whether the sensed film thickness is within a tolerance. If it is not, a film thickness correcting process is executed which is a feature of this embodiment. The control system 12 stores in itself the current rotational speed of the coater 4 and data of a relation between the viscosity of the resist material and the resist coating thickness after the process, corresponding to the rotational speed. The film thickness is not affected much by the process period by the coater 4, but is much affected by the rotational speed thereof.

Figure 18:
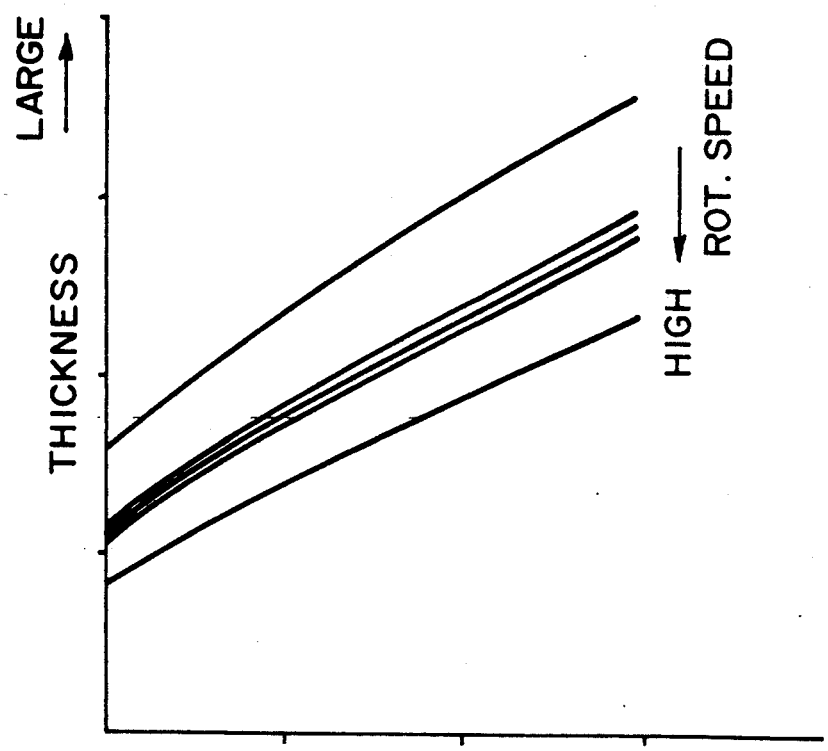
FIG. 18 is a graph indicating a relation between a viscosity of photoresist and the resist film thickness at various rotational speeds of the coater.

FIG. 18 indicates an example of the relationship between the resist viscosity and the resist thickness with a parameter of the rotational speed. In the control system 12, the current viscosity of the resist is figures out on the basis of the data. It will be understood that the data may be used for obtaining the rotational speed of the coater required for resist thicknesses corresponding to various resist viscosities, and therefore, the control system 12 figures out an appropriate rotational speed of the coater to provide the desired film thickness.

Figure 19:
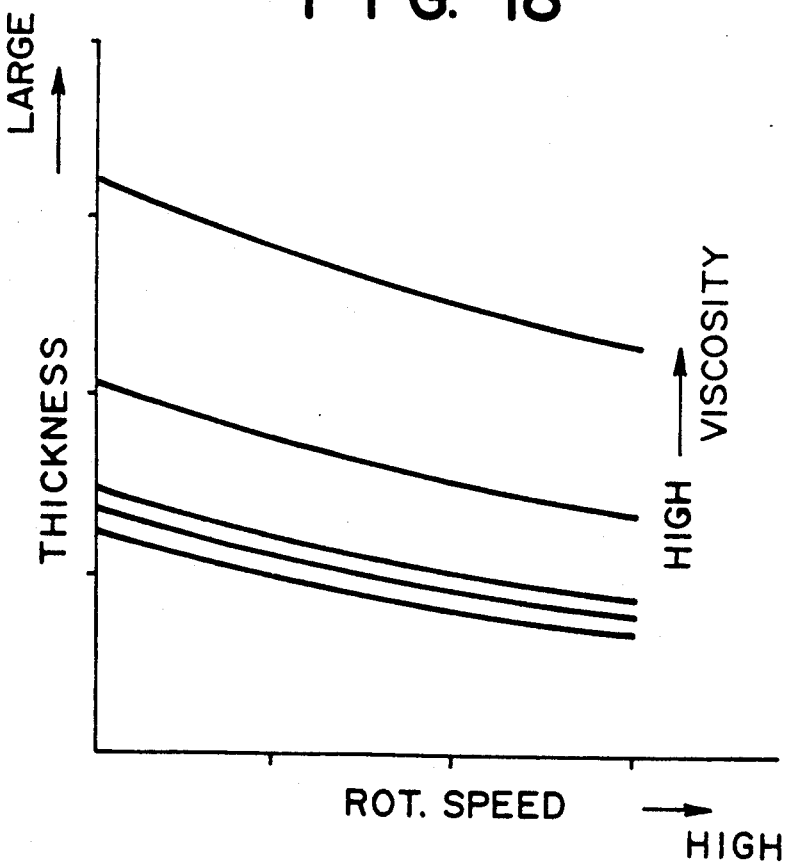
FIG. 19 is a graph indicating a relation between a rotational speed of the coater and the film thickness at various viscosities of the resist.

FIG. 19 shows an example of a relation between the rotational speed of the coater 4 and the resist thickness with a parameter of the viscosity of the resist. The control system 12 produces an instruction signal to the power source for the coater for wafer rotation on the basis of the calculated data. The voltage to the power source is changed to change the motor rotational speed to the appropriate rotational speed.

In this manner, even if the viscosity of the resist changes by for example, supplying resist liquid to the resist bin 46 during the coating process, the resulting film thickness error can be automatically corrected during the process. Also, the variation of the film thickness can be detected and corrected quickly, thus minimizing the number of rejected wafers attributable to the film thickness error.

As described, according to this embodiment, the adverse affect resulting from variations in the thickness of the formed film attributable to the viscosity variation of the coating material can be minimized. And, the application process can be executed while correcting the film thickness error on the member to be coated, a plate like member, for example a wafer. Therefore, the number of the rejected plate like members attributable to the film thickness error can be minimized.

FIG. 20 illustrates an example of a chemical applying mechanism usable in FIG. 10. It comprises an application nozzle 401 which is constituted by a tube member having a discharge outlet (not shown) at an end thereof. It further comprises a plate for fixing and holding a nozzle 401, a rotational shaft 403 for the plate 402, a correcting rod 404 for rotating the plate 402 about the rotational shaft 403, a position adjusting knob 405 for the connecting rod 4, a driving disk 406 for the connecting rod 404, a sensor plate 407 for setting a reference point of the nozzle 401, a sensor 408 for sensing the sensor plate 407, a motor 409 for rotationally driving the disk 406, a supporting plate 410 for supporting and fixing the disk 406 and the motor 409, and a knob 411 for adjusting the position of the supporting plate 410. Designated by 412 is a wafer on which the chemical is to be applied. An end of the correcting rod 404 is threaded around on the screw 405a which is rotatable by the knob 405. By rotating the knob 405, a distance A between the rotational shaft of the plate 402 and the connecting rod 404 changes so that a sweeping range (rotational movement range) of the nozzle 401 changes. Here, if the distance A is made larger, the rotational range decreases, while on the other hand, if the distance A is decreased, the rotational range becomes larger. The positional relation between the sensor 408 and the sensor plate 407 is preset such that the sensor 408 senses the sensor plate 408 at such a position that the end of the nozzle 401 is at the reference position (the center of the wafer 12, for example). The supporting plate 410 is threaded around the screw 411a which is rotatable by the knob 411. By rotating the knob 411, the supporting plate 410 moves along the screw 411a, whereby the discharging position of the nozzle 401 can be changed without changing the rotational angle of the nozzle 401. The movable range of the nozzle 401 is preset so that the discharge port of the nozzle 401 can swing to outside of the wafer 412 surface (off-set positions). In operation, the reference position and the sweeping range of the nozzle 401 is first set by the knob 405 and 411 in dependence on the size of the wafer 412. Here, the sweeping range may be a range R from the center of the wafer 412 and the off-set position or may be a range D between opposite off-set positions through the center of the wafer 412. After the adjustments, the chemical is applied on the wafer 412 while sweeping the nozzle 401. The rotational speed of the motor 409, the moving speed of the nozzle and timing of the chemical discharge may be automatically controlled with program in dependence of the wafer 412 to be processed.

As described in the foregoing, since the applicator according to this embodiment effects the sweeping action, the liquid can be uniformly distributed over the entire surface of the member to be coated in approximately one half of the time period required by a stationary nozzle which is conventional. Therefore, when a developing liquid is applied, the difference in the reaction period between the central portion and the marginal portion is reduced, so that the developing action becomes uniform over the surface of the member. Additionally, it is made possible that the nozzle may be placed at the off-set position outside the member to be coated in stand-by state, whereby inadvertent dropping of the liquid on the member to be coated such as a wafer can be prevented.

Figure 21:
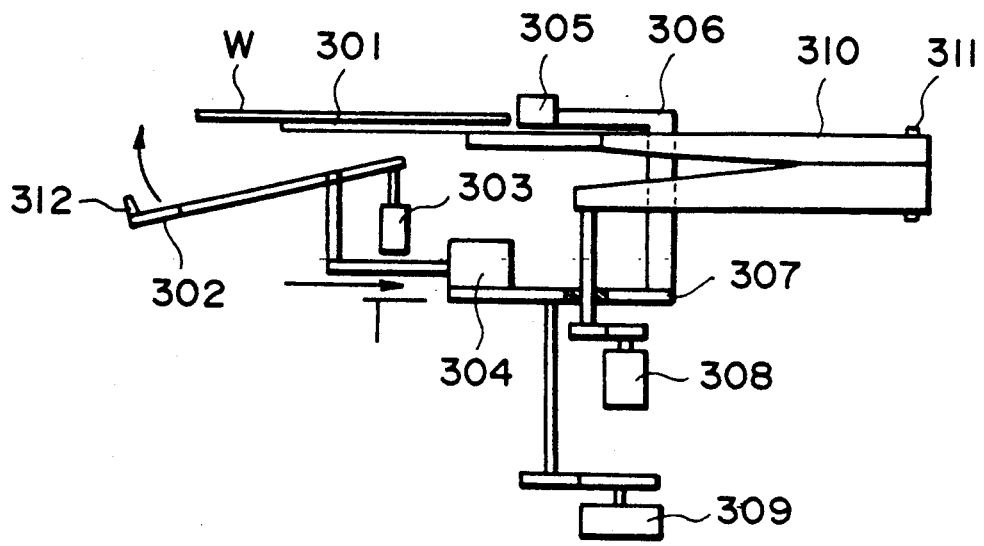
FIG. 21 is a side view of an example of a handling mechanism usable with FIG. 1 arrangement.
Figure 22:
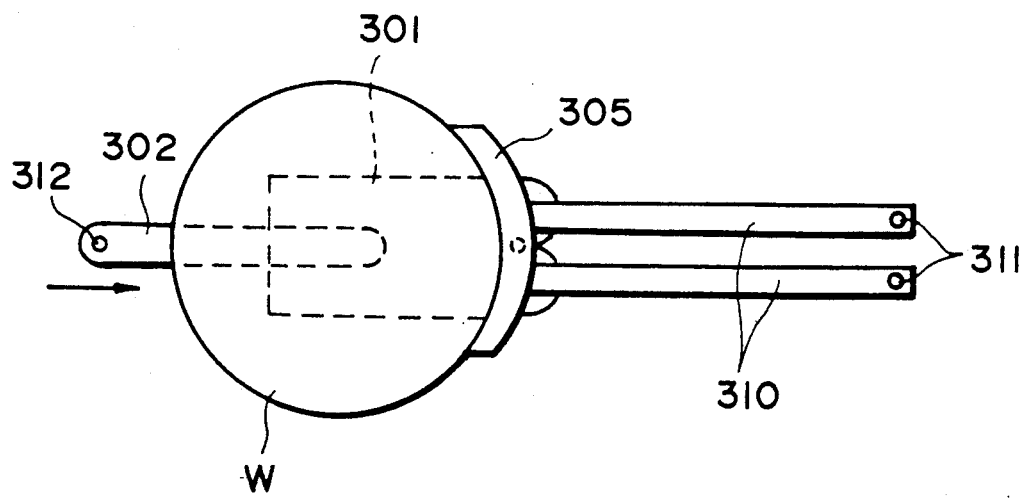
FIG. 22 is a top plan view of the handling mechanism.
Figure 23:
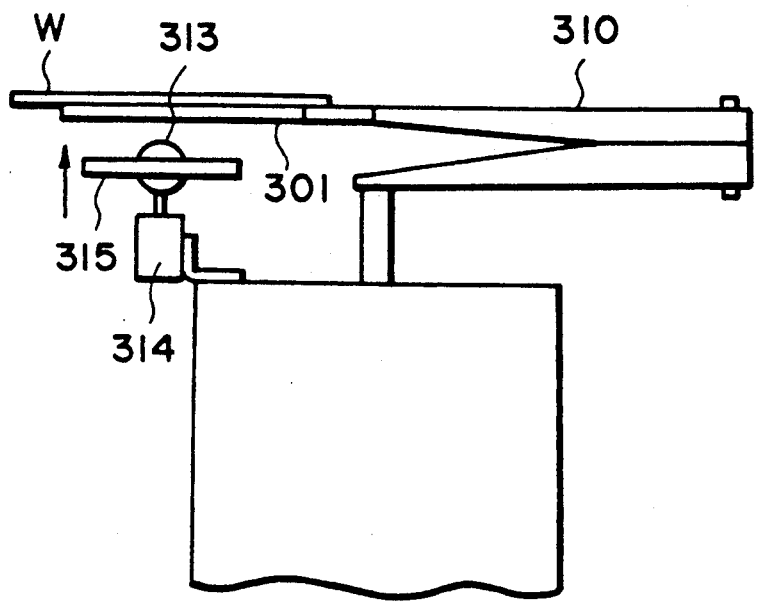
FIG. 23 is a side view of another embodiment of the handling mechanism.
Figure 24:
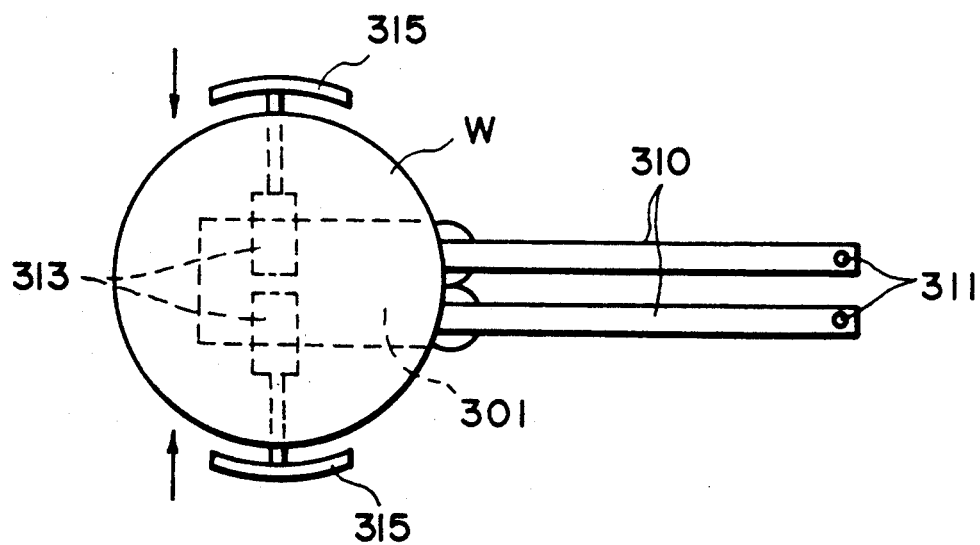
FIG. 24 is a top plan view of the handling mechanism of FIG. 23.

FIGS. 21 and 22 illustrate a detailed example of the handling mechanism, which comprises a movable carriage 301 for supporting a wafer W. The movable carriage 301 is pivotably connected adjacent one end of a couple of articulated arms 310. The arms 310 are shown as taking a completely folded or collapsed position at the articulations 311 in the middle of the articulated arms 310. The other ends of the articulated arms 310 are rotationally driven in the opposite directions by the motor 308. A supporting table 307 supports said other ends of the articulated arms 310 for rotation. The supporting table 307 is rotatable in a horizontal plane by a motor 309. A post 306 is fixed to the supporting table 307, and to the post 306 a centering member 5 is fixed and supported at a retracted position of the arms 310. The centering member 305 has a peripheral shaped to meet a part of the circumferential periphery of the wafer W in the example shown in the Figure. By abutting the outer periphery of the wafer W to the centering member 305, the wafer w is centered on the supporting table 307. A piston-cylinder device 304 is mounted to the supporting table 307, by which device 304 an urging arm 302 is supported for movement in the moving direction of the moving table 301, and the urging arm 302 is pivotable by another piston-cylinder device 303.

The urging arm 302, when taking its lower position, allows movement of the movable carriage 301 by a pantagraph movement of the arms 310. The urging arm 302 is moved to its upper position by the piston-cylinder device 303 when the movable carriage 301 carrying the wafer W returns to its retracted position, and is further moved by the piston-cylinder device 304 so that its end projection 312 urges the wafer to the configurated periphery of the centering member 305, thus positioning the wafer at the reference position and confines it at this position. With this state, the supporting table 307 is rotated by the motor 309 so as to direct the wafer to a desired processing unit. During this rotation, the wafer W is kept confined, and therefore the wafer is not drifted.

The forward and backward movements of the movable carriage 301 by the pantagraph movements of the articulated arms 310 are such that when the movable carriage 301 starts to be retracted from the expanded position (the arms are substantially parallel to each other), the movable carriage 301 is relatively slowly accelerated; the speed of the movable carriage 301 reaches its maximum speed when it is on the articulations 311; and then, the movable carriage 301 is decelerated slowly; and finally it slowly stops at the retracted end position. This profile of the carriage movement also prevents the wafer from drifting.

As described in the foregoing, according to the articulated arm embodiment of the present invention, the member to be carried is confined at a particular center position on the carriage by the confining means, and therefore, the member to be carried does not drift on the carriage nor falls from the carriage. Additionally, since it is confined at the center position, the member transfer position is constant irrespective of the operating units, and therefore, it is not necessary to relocate the wafer at the respective processing units, thus eliminating necessity of providing a centering mechanism with each of the units.

While the invention has been described with reference to the structures disclosed herein, it is not confined to the details set forth and this application is intended to cover such modifications or changes as may come within the purposes of the improvements or the scope of the following claims.

What is claimed is:

1. A wafer handling apparatus comprising:

a common desk including a top surface having a front zone, a middle zone and a rear zone, the front zone being capable of receiving plural indexers functioning as a wafer sender and/or receiver;

at least one wafer processing unit disposed adjacent lateral sides of the middle zone;

a wafer baking oven disposed adjacent the rear zone, said oven including plural chambers provided with wafer supporting surfaces for accomodating and baking the wafers therein, wherein said chambers are disposed in the form of a multi-stage chamber in a direction perpendicular to the supporting surfaces; and a wafer handling mechanism disposed adjacent a middle of the front zone, said wafer processing units and said oven.

2. An apparatus according to claim 1, further comprising a forced wafer cooling unit disposed below said oven.

3. An apparatus according to claim 1, further comprising a forced wafer cooling unit disposed adjacent a middle of the middle zone.

4. An apparatus according to claim 1, wherein said wafer processing unit is a spinner wherein a coating agent is dropped on a wafer while the wafer is being rotated, to apply the coating agent on the entire surface of the wafer.

5. An apparatus according to claim 4, wherein the spinner includes driving means for rotating the wafer, detecting means for detecting the thickness of the coating on the wafer and means for controlling a rotational speed of the wafer in response to an output of the detecting means.

6. An apparatus according to claim 4, wherein said control means stores data of relations among a rotational speed of the driving means, the thickness of the film and viscosity of the coating agent.

7. An apparatus according to claim 5, wherein said detecting means is associated with the wafer baking oven.

8. An apparatus according to claim 4, wherein the spinner includes a nozzle for dropping the coating agent which is in the form of liquid and a moving mechanism for imparting relative movement between the nozzle and the wafer.

9. An apparatus according to claim 8, wherein the moving mechanism moves an outlet of the nozzle along an arcuate path.

10. An apparatus according to claim 9, wherein said moving mechanism includes adjusting means for adjusting a position of the nozzle outlet.

11. An apparatus according to claim 9, wherein said moving mechanism includes adjusting means for adjusting a movable range of the nozzle outlet.

12. An apparatus according to claim 1, wherein said wafer handling mechanism includes a table for supporting the wafer, an arm mechanism for moving the supporting table and a support for the arm mechanism.

13. An apparatus according to claim 1, wherein said wafer handling mechanism includes a rotating mechanism for rotating the support.

14. An apparatus according to claim 12, wherein said wafer handling mechanism includes a positioning mechanism for positioning the wafer on the supporting table.

15. An apparatus according to claim 14, wherein the positioning mechanism is on the supporting table.

16. A wafer handling apparatus, comprising:
an indexer to which a wafer carrier carrying wafers is mountable;
an applying unit for applying liquid agent on the wafer while it is being rotated to apply the liquid agent on the entire surface thereof;
a baking unit for baking the wafer, including plural heating chambers for heating the wafers, wherein said chambers are disposed in the form of a multi-stage chamber in a predetermined direction;
a wafer conveying mechanism for transferring the wafer between the wafer carrier and the applying unit and for transferring the wafer between the applying unit and the baking unit, said wafer conveying mechanism including a supporting table for supporting the wafer, an arm mechanism for moving the supporting table and a supporting table for supporting the arm mechanism.

17. An apparatus according to claim 16, wherein said wafer conveying mechanism includes a rotating mechanism for rotating the supporting table.

18. An apparatus according to claim 16, wherein said wafer conveying mechanism includes a positioning mechanism for positioning the wafer on the supporting table.

19. An apparatus according to claim 18, wherein said positioning mechanism is mounted on the supporting table.

* * * * *